US010056024B2

(12) United States Patent
Kim et al.

(10) Patent No.: US 10,056,024 B2
(45) Date of Patent: Aug. 21, 2018

(54) DISPLAY DEVICE

(71) Applicant: LG Display Co., Ltd., Seoul (KR)

(72) Inventors: HwaYoung Kim, Paju-si (KR); ByungMu Jung, Goyang-si (KR); SangSoo Han, Paju-si (KR); SungJoon Moon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 146 days.

(21) Appl. No.: 15/136,804

(22) Filed: Apr. 22, 2016

(65) Prior Publication Data

US 2016/0321983 A1 Nov. 3, 2016

(30) Foreign Application Priority Data

Apr. 30, 2015 (KR) ........................ 10-2015-0061054

(51) Int. Cl.

*G09G 3/20* (2006.01)
*H01L 27/32* (2006.01)
*G09G 3/3266* (2016.01)
*G09G 3/36* (2006.01)

(52) U.S. Cl.

CPC ....... *G09G 3/2092* (2013.01); *H01L 27/3276* (2013.01); *G09G 3/3266* (2013.01); *G09G 3/3648* (2013.01); *G09G 3/3677* (2013.01); *G09G 2310/027* (2013.01); *G09G 2310/0267* (2013.01); *G09G 2310/0286* (2013.01); *G09G 2310/0289* (2013.01); *G09G 2310/061* (2013.01); *G09G 2310/08* (2013.01)

(58) Field of Classification Search

CPC .. G09G 3/2092; G09G 3/3266; G09G 3/3648; G09G 2310/0267; G09G 2310/027; G09G 2310/0286; G09G 2310/0289; G09G 2310/061; G09G 2310/08; H01L 27/3276

See application file for complete search history.

(56) References Cited

U.S. PATENT DOCUMENTS 8,963,936 B1 * 2/2015 Khoury .................... G09G 5/36 345/531

2004/0021625 A1 * 2/2004 Lee ...................... G09G 3/3614 345/87

2012/0188220 A1 * 7/2012 Abe ....................... G09G 3/006 345/212

2016/0133215 A1 * 5/2016 Yeo ........................ G09G 3/006 345/210

* cited by examiner

*Primary Examiner* — Sahlu Okebato

(74) *Attorney, Agent, or Firm* — Fenwick & West LLP

(57) ABSTRACT

A display device is disclosed, which may supply gate signals to allow pulse widths of gate signals supplied to adjacent gate lines to be overlapped with each other and at the same time minimize cost increase caused by increase of the number of line memories. The display device comprises a display panel, a gate driver and a timing controller. The display panel includes gate lines, data lines and pixels provided at crossing areas between the gate lines and the data lines. The gate driver supplies gate signals to the gate lines. The timing controller supplies a start signal and gate clock signals for controlling an operation timing of the gate driver to the gate driver. One frame period includes an active period for supplying the gate signals to the gate lines and a vertical blank period for not supplying the gate signals to the gate lines, and the start signal is supplied within the vertical blank period.

15 Claims, 17 Drawing Sheets

N th frame period
ACT
R1
R2
R3
R4
R5
R6
R7
R8
R9
R10
R11
R12
R13
R14
V2
V1
DE
T-Con in
T-Con out
VST
GCLK 1
GCLK 2
GCLK 3
GCLK 4
GCLK 5
GCLK 6
GCLK 7
GCLK 8
VDD_EO
VGH
VGL
G1
DCLK 1
DCLK 2
DCLK 3
DCLK 4

N th frame period
ACT
R1
R2
R3
R4
R5
R6
R7
R8
R9
R10
R11
R12
R13
R14
V2
V1
DE
T-Con in
T-Con out
VST
GCLK 1
GCLK 2
GCLK 3
GCLK 4
GCLK 5
GCLK 6
GCLK 7
GCLK 8
VDD_EO
VGL
VGH
VGL
VGH
VGL
G1
DCLK 1
DCLK 2
DCLK 3
DCLK 4

DISPLAY DEVICE

CROSS REFERENCE TO RELATED APPLICATIONS

This application claims the benefit of the Korean Patent Application No. 10-2015-0061054 filed on Apr. 30, 2015, which is hereby incorporated by reference for all purposes as if fully set forth herein.

BACKGROUND OF THE INVENTION

Field of the Invention

The present invention relates to a display device.

Discussion of the Related Art

With the development of information society, various demands for display devices for displaying picture images have been increasing. In this respect, various display devices such as a liquid crystal display (LCD), a plasma display panel (PDP), and an organic light emitting display (OLED) device have been recently used.

The display device includes a display panel, a gate driver, a data driver, and a timing controller. The display panel includes data lines, gate lines, and a plurality of pixels formed at crossing portions between the data lines and the gate lines and supplied with data voltages of the data lines when gate signals are supplied to the gate lines. The pixels emit light with a predetermined brightness in accordance with the data voltages. The gate driver supplies the gate signals to the gate lines. The data driver includes source drive integrated circuits (hereinafter, referred to as "ICs") that supply the data voltages to the data lines. The timing controller controls an operation timing of each of the gate driver and the data driver.

For example, the gate driver may be formed in a non-display area of the display panel in a gate driver in panel (GIP) mode. In this case, the gate driver includes stages having a plurality of transistors, and supplies gate signals for swinging a gate high voltage and a gate low voltage to the gate lines in accordance with a start signal and gate clock signals input from the timing controller.

Display devices with UHD (ultra-high definition, 3840×2160) has been recently launched. Since the charging time of a data voltage charged in each of pixels is not sufficient in the display device of UHD, a gate driver supplies gate signals in such a manner that pulse widths of the gate signals supplied to adjacent gate lines are overlapped with each other. In this case, since pulse widths of adjacent gate clock signals are overlapped with each other, pulse widths of a start signal and gate clock signals are wider. Particularly, the number of line memories for delaying image data supplied from a timing controller to a data driver increase because the pulse width of the start signal is wider. The manufacturing cost may increase due to increase of the number of line memories.

SUMMARY OF THE INVENTION

Accordingly, the present disclosure is directed to a display device that alleviates one or more of the aforementioned problems.

An advantage of the present disclosure is to provide a display device that may supply gate signals to allow pulse widths of gate signals supplied to adjacent gate lines to be overlapped with each other and at the same time to reduce the increase in cost caused by the increase of the number of line memories.

Additional advantages and features will be set forth in part in the description which follows and in part will become apparent to those having ordinary skill in the art upon examination of the following or may be learned from practice of the invention.

To achieve these objectives and other advantages and in accordance with the purpose of the discloses embodiments, a display device comprises a display panel including gate lines, data lines and pixels provided at crossing areas between the gate lines and the data lines; a gate driver supplying gate signals to the gate lines; and a timing controller supplying a start signal and gate clock signals for controlling an operation timing of the gate driver to the gate driver, wherein one frame period includes an active period for supplying the gate signals to the gate lines and a vertical blank period for not supplying the gate signals to the gate lines, and the start signal is supplied within the vertical blank period.

In another embodiment, a display device for displaying a video during a plurality of frames includes a display panel including a plurality of gate lines, a plurality of data lines, and a plurality of pixels provided at crossing areas between the plurality of gate lines and the plurality of data lines; a gate driver generating gate signals to be supplied to the gate lines, wherein each frame of the plurality of frames includes an active period when the gate signals are supplied to the gate lines, and a vertical blank period when gate signals are not supplied to the gate lines; and a timing controller supplying a start signal and gate clock signals for controlling an operation timing of the gate driver, wherein the start signal transitions from an active state to an inactive state within the vertical blank period.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
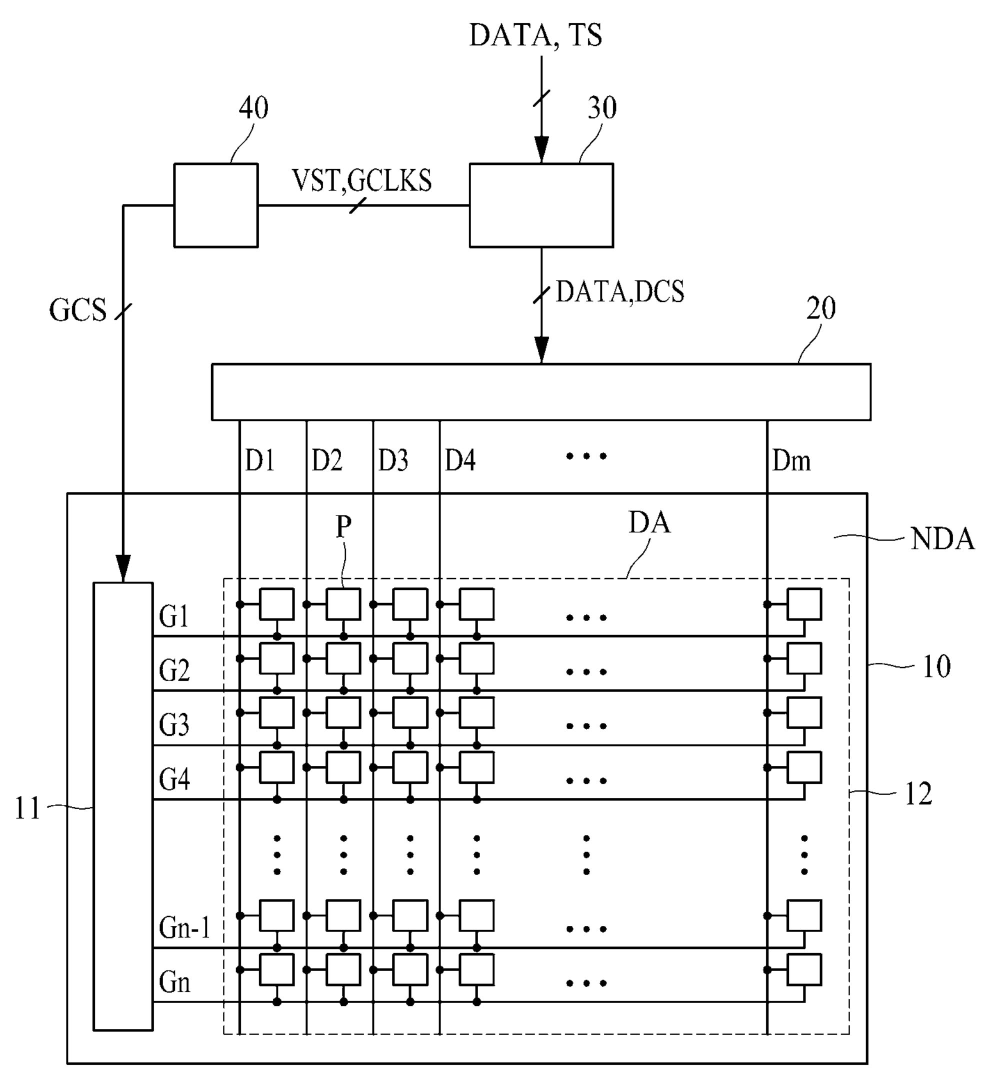
FIG. 1 is a block diagram illustrating a display device, according to one embodiment.

Reference will now be made in detail to the various embodiments, examples of which are illustrated in the accompanying drawings. Wherever possible, the same reference numbers are used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. In the following description, when the detailed description of the relevant known function or configuration is determined to unnecessarily obscure the important point of the present invention, the such detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another element. Therefore, a first element could be termed a second element, and, similarly, a second element could be termed a first element, without departing from the scope of the present invention.

"X-axis direction", "Y-axis direction" and "Z-axis direction" should not be construed by a geometric relation only of a mutual vertical relation, and may have broader directionality within the range that elements of the present invention may act functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, the preferred embodiments of the present invention will be described in detail with reference to the accompanying drawings.

FIG. 1 is a block diagram illustrating a display device, according to the one embodiment. Referring to FIG. 1, the display device includes a display panel 10, a gate driver 11, a data driver 20, and a timing controller 30.

Every display device that supplies data voltages to pixels through line scanning for supplying gate signals to gate lines G1 to Gn may be used as the display device. For example, the display device may be realized as any one of a liquid crystal display, an organic light emitting display, a field emission display, and an electrophoresis display.

The display panel 10 includes data lines D1 to Dm (where m is a positive integer of 2 or more), gate lines G1 to Gn (where n is a positive integer of 2 or more), pixels P connected to the data lines D1 to Dm and the gate lines G1 to Gn, and a gate driver 11.

Each pixel P may be connected to any one of the data lines D1 to Dm and any one of the gate lines G1 to Gn. As such, the pixel P is supplied with a data voltage of the data line when a gate signal is supplied to the gate line, and emits light at a predetermined brightness in accordance with the supplied data voltage.

Figure 2:
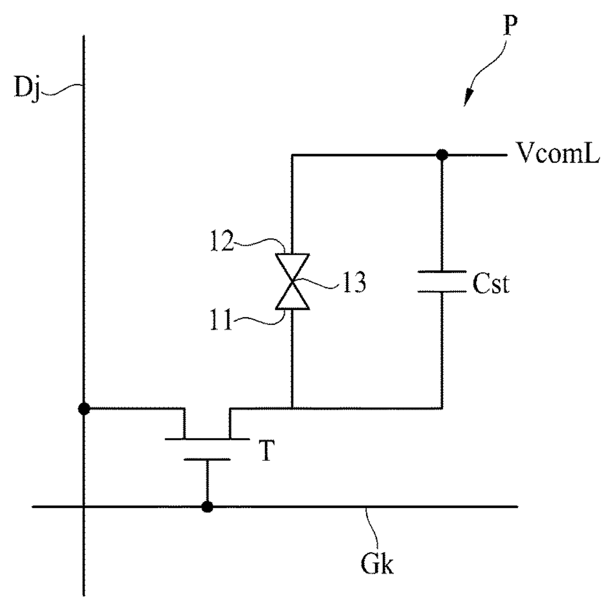
FIG. 2 illustrates one example of a pixels of FIG. 1.

If the display device is realized as a liquid crystal display, each of the pixels P may include a transistor T, a pixel electrode 11, and a storage capacitor Cst as shown in FIG. 2. The transistor T supplies a data voltage of the jth data line Dj (where j is a positive integer that satisfies $1 \leq j \leq m$) to the pixel electrode 11 in response to a gate signal of the kth gate line Gk (where k is a positive integer that satisfies $1 \leq k \leq n$). In this embodiment, each of the pixels P may control a transmittance ratio of light entering from a backlight unit by driving liquid crystals of a liquid crystal layer 13 by an electric field generated by a potential difference between the data voltage supplied to the pixel electrode 11 and a common voltage supplied to a common electrode 12. The common electrode 12 is supplied with a common voltage from a common voltage line VcomL, and backlight unit is arranged below the display panel 10 and irradiates uniform light to the display panel 10. Additionally, the storage capacitor Cst is provided between the pixel electrode 11 and the common electrode 12, and uniformly maintains a voltage difference between the pixel electrode 11 and the common electrode 12.

Figure 3:
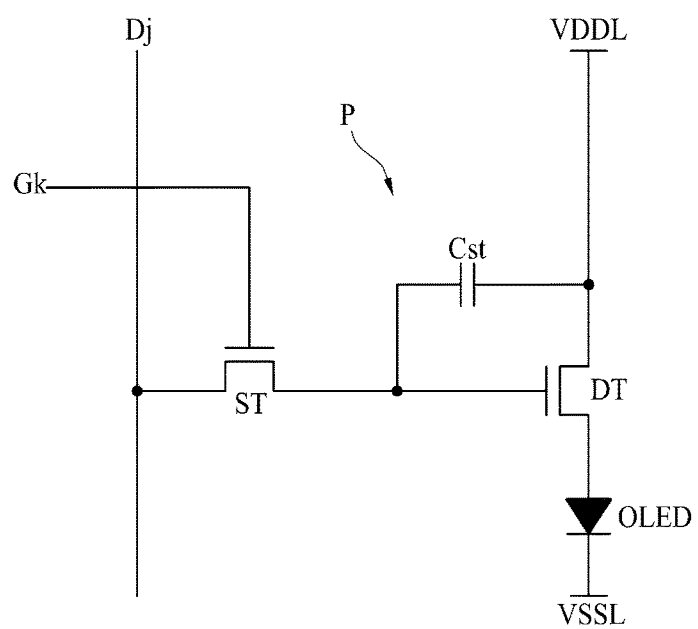
FIG. 3 illustrates another example of a pixels of FIG. 1.

If the display device is realized as an organic light emitting display, each of the pixels P may include an organic light emitting diode OLED, a scan transistor ST, a driving transistor DT, and a storage capacitor Cst as shown in FIG. 3. The scan transistor ST supplies a data voltage of the jth data line Dj to a gate electrode of the driving transistor DT in response to a gate signal of the kth gate line Gk. The driving transistor DT controls a driving current flowing from a high potential voltage line VDDL from the organic light emitting diode OLED in accordance with a data voltage supplied to the gate electrode. The organic light emitting diode OLED is provided between the driving transistor DT and a low potential voltage line VSSL, and emits light with a predetermined brightness in accordance with the driving current. The storage capacitor Cst may be provided between the gate electrode and the high potential voltage line VDDL of the driving transistor DT to uniformly maintain the voltage of the gate electrode of the driving transistor DT.

Referring back to FIG. 1, the gate driver 11 is connected to the gate lines G1 to Gn and supplies gate signals. In more detail, the gate driver 11 receives a gate control signal GCS from the timing controller 30, and generates gate signals in accordance with the gate control signal GCS to supply the generated gate signals to the gate lines G1 to Gn.

The display panel 10 may be divided into a display area DA and a non-display area NDA. The display area DA is an area where pixels P are provided to display an image. The non-display area NDA is an area provided near the display area DA, where an image is not displayed. The gate driver 11 may be provided in the non-display area NDA in a gate drive in panel (GIP) mode. The gate driver 11 is provided at, but not limited to, one side of the display area DA in FIG. 1. For example, the gate driver 11 may instead be provided at both sides of the display area DA. A detailed description of the gate driver 11 will be described later with reference to FIGS. 4A and 4B.

The data driver 20 is connected to the data lines D1 to Dm. The data driver 20 receives digital video data DATA and a data control signal DCS from the timing controller 30, and converts the digital video data DATA to analog data voltages in accordance with the data control signal DCS. The data driver 20 supplies the analog data voltages to the data lines D1 to Dm. The data driver 20 may include one source drive integrated circuit (hereinafter, referred to as "IC") or a plurality of source drive ICs.

The timing controller 30 receives the video data DATA and timing signals TS from an external system board (not shown). The timing signals TS may include a vertical synchronization signal, a horizontal synchronization signal, a data enable signal, and a dot clock. The timing controller 30 generates a gate control signal for controlling operation timing of the gate driver 11 and a data control signal DCS for controlling operation timing of the data driver 20 on the basis of the timing signals TS.

The gate control signal may include a start signal VST and gate clock signals GCLKS as shown in FIG. 1. A detailed description of the start signal VST and the gate clock signals GCLKS will be described later with reference to FIGS. 6A and 6B.

The timing controller 30 supplies the video data DATA and the data control signal DCS to the data driver 20. The timing controller 30 supplies the start signal VST and the gate clock signals GCLKS to the gate driver 11 through a level shifter 40.

The level shifter 40 varies a swing width of the start signal VST and the gate clock signals GCLKS. Specifically, the start signal VST and the gate clock GCLKS may initially swing between a first voltage level V1 and a second voltage level V2. Thereafter, the level shifter shifts the voltage swing levels of the start signal VST and the gate clock GCLKS to be between a gate low voltage VGL and a gate high voltage VGH. If the timing controller 30 generates the start signal VST and the gate clock signals GCLKS that switch between the gate low voltage and the gate high voltage, the power consumption of the display device may increase. Instead, the timing controller 30 may generate the start signal VST and the gate clock signals GCLKS to switch between a first voltage level and a second voltage level, where the voltage range between the first and second voltage levels is smaller than a voltage range between the gate low voltage and the gate high voltage, thus, reducing the power consumption of the display device.

Figure 4A:
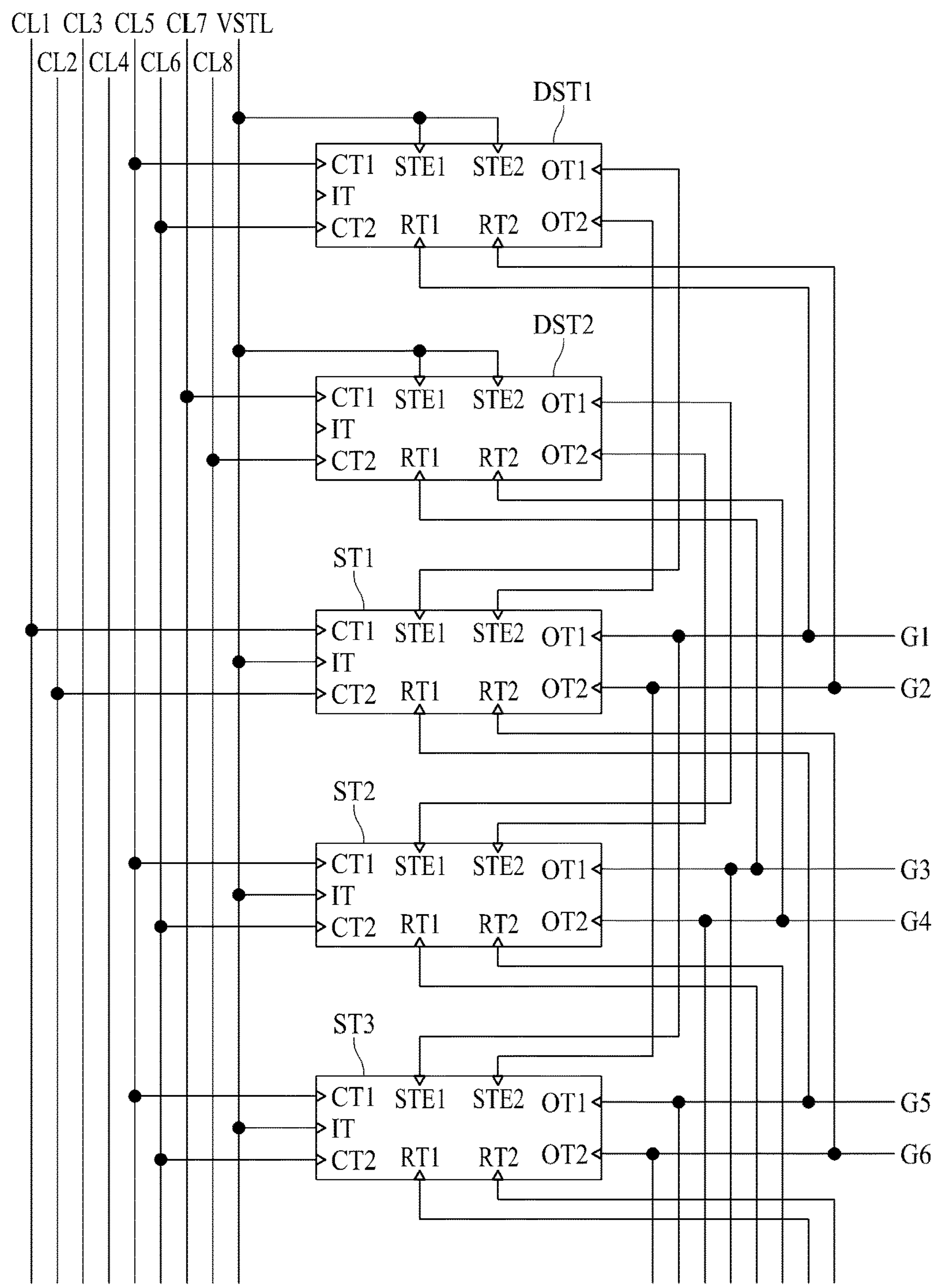
FIGS. 4A and 4B are detailed block diagrams illustrating a gate driver of FIG. 1.
Figure 4B:
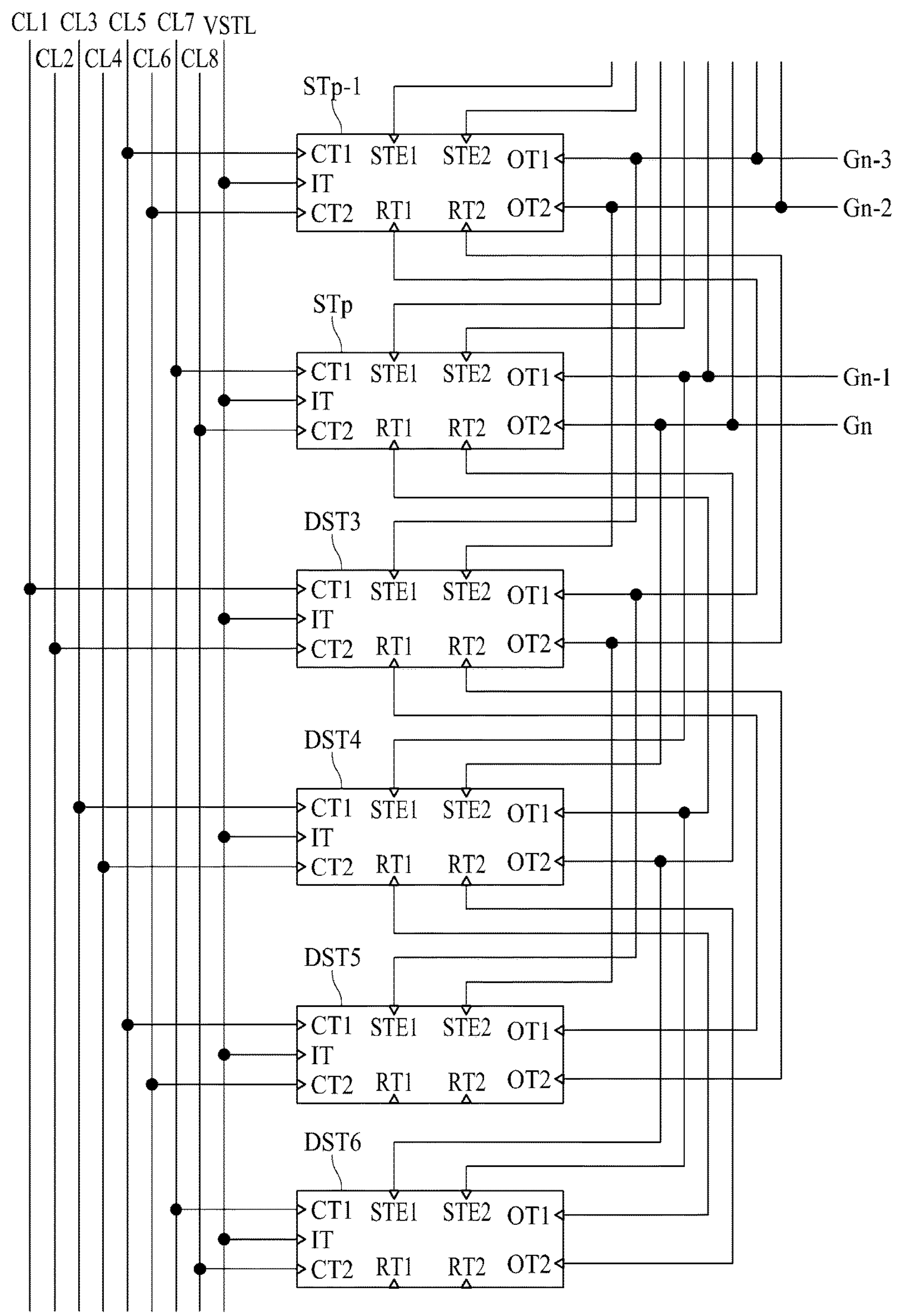

FIGS. 4A and 4B are detailed block diagrams illustrating a gate driver of FIG. 1. For convenience of description, first to third stages ST1, ST2 and ST3 and first and second dummy stages DST1 and DST2 of the gate driver 11 are only shown in FIG. 4A. Also, for convenience of description, p−1th and pth stages STp−1 and STp (where p is a positive integer that satisfies 1≤p≤2n) and third to sixth dummy stages DST3 to DST6 are only shown in FIG. 4B.

A start signal line VSTL to which the start signal VST is supplied and gate clock signal lines CL1 to CL8 to which first to eighth gate clock signals GCLK1 to GCLK8 are supplied are provided in the gate driver 11 as shown in FIGS. 4A and 4B. The start signal VST and the first to eighth gate clock signals GCLK1 to GCLK8 are the gate control signals and supplied from the timing controller 30.

In the following description, "a front stage" indicates a stage located in front of a reference stage, and "a rear stage" indicates a stage located behind the reference stage. For example, front stages of the third stage ST3 indicate the first and second stages ST1 and ST2, and rear stages of the third stage ST3 indicate the fourth to pth stages ST4 to STp.

A qth stage STq (where q is a positive integer that satisfies 1≤q≤p) of the gate driver 11 is connected to 2q−1th and 2qth gate lines G2*q*−1 and G2*q*. Therefore, the qth stage STq outputs a gate signal to each of the 2q−1th and 2qth gate lines G2*q*−1 and G2*q*. The dummy stages DST1 to DST6 do not output the output signals to the gate lines. That is, the dummy stages DST1 to DST6 output the output signals to reset terminals RT1 and RT2 of the rear stage and start terminals STE1 and STE2 of the rear stage as carry signals.

Each of the dummy stages DST1 to DST6 and the stages ST1 to STp includes first and second start terminals STE1 and STE2, first and second reset terminals RT1 and RT2, first and second clock terminals CT1 and CT2, an initialization terminal IT, and first and second output terminals OT1 and OT2.

The first start terminal STE1 of each of the stages ST1 to STp and the third to sixth dummy stages DST3 to DST6 may be connected to the first output terminal OT1 of the front stage. For example, the first start terminal STE1 of the qth stage STq may be connected to the first output terminal OT1 of the (q−2)th stage STq−2. The first and second start terminals STE1 and STE2 of each of the first and second dummy stages DST1 and DST2 may be connected to the start signal line VSTL.

The second start terminal STE2 of each of the stages ST1 to STp and the third to sixth dummy stages DST3 to DST6 may be connected to the second output terminal OT2 of the front stage. For example, the second start terminal STE2 of the qth stage STq may be connected to the second output terminal OT2 of the (q−2)th stage STq−2. The second start terminal STE2 of each of the first and second dummy stages DST1 and DST2 may be connected to the start signal line VSTL.

A first reset terminal RT1 of each of the stages ST1 to STp and the first to fourth dummy stages DST1 to DST4 may be connected to the first output terminal OT1 of the rear stage. For example, the first reset terminal RT1 of the qth stage STq may be connected to the first output terminal OT1 of the (q+2)th stage STq+2. Since the rear stage does not exist at the fifth and sixth dummy stages DST5 and DST6, the first reset terminal RT1 of each of the fifth and sixth dummy stages DST5 and DST6 is not connected to the first output terminal OT1 of the rear stage.

A second reset terminal RT2 of each of the stages ST1 to STp and the first to fourth dummy stages DST1 to DST4 may be connected to the second output terminal OT2 of the rear stage. For example, the second reset terminal RT2 of the qth stage STq may be connected to the second output terminal OT2 of the (q+2)th stage STq+2. Since the rear stage does not exist at the fifth and sixth dummy stages DST5 and DST6, the second reset terminal RT2 of each of the fifth and sixth dummy stages DST5 and DST6 is not connected to the second output terminal OT2 of the rear stage.

Figure 6A:
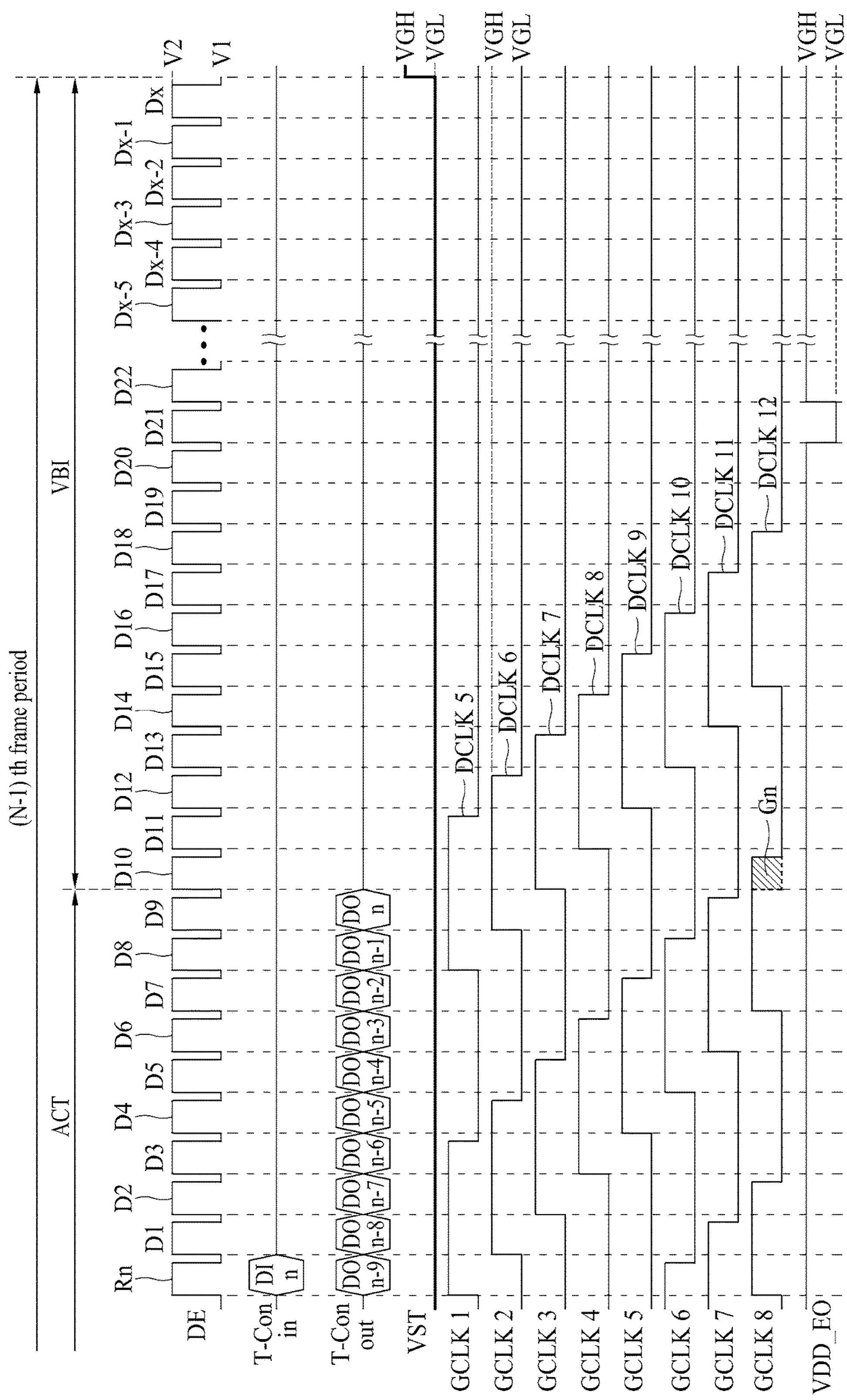
FIGS. 6A and 6B are waveforms illustrating a data enable signal, image data input to a timing controller, image data output from the timing controller, a start signal, clock signals and VDD control signals according to a first embodiment.
Figure 6B:
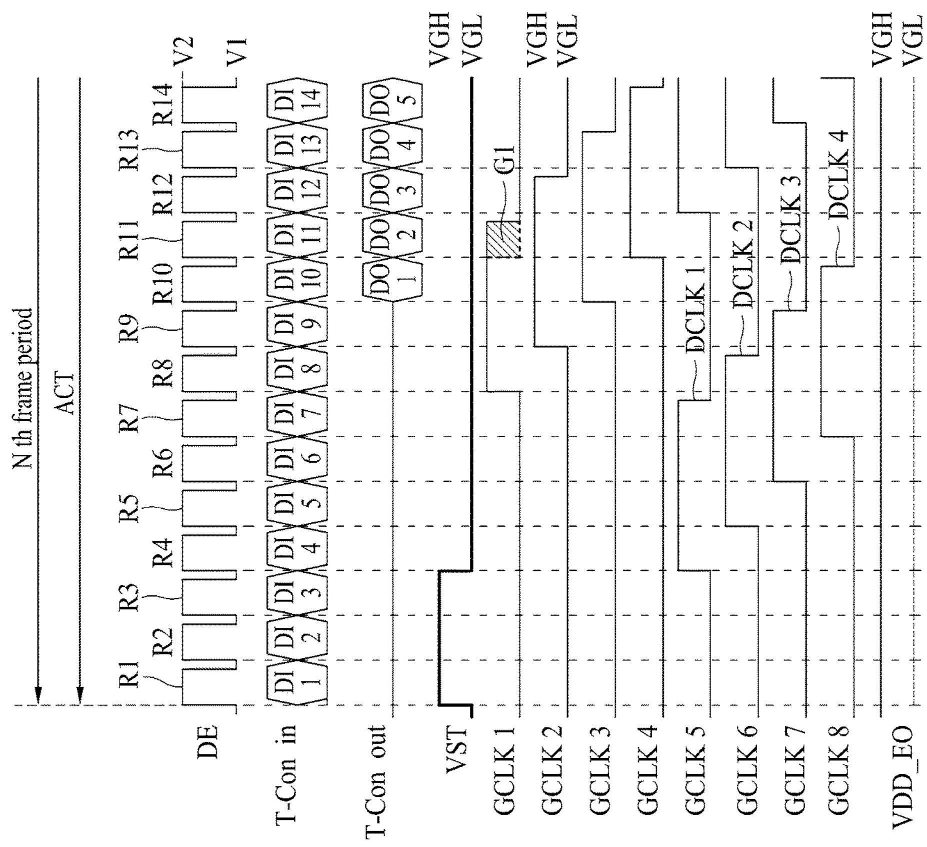

Each of first and second clock terminals CT1 and CT2 of each of the stages ST1 to STp is connected to any one of clock lines CL1 to CL8. Preferably, clock signals are i-phase (where i is a natural number of 4 or more) clock signals of which phases are delayed sequentially to obtain a sufficient charging time during high speed driving. Although the clock signals illustrated in the present disclosure are 8-phase clock signals overlapped by a predetermined period, of which phases are delayed sequentially as shown in FIGS. 6A and 6B, it should be noted that the clock signals are not limited to the examples of FIGS. 6A and 6B. Each of the clock signals transition with a predetermined period between a gate high voltage VGH and a gate low voltage VGL.

The first and second clock terminals CT1 and CT2 of each of the stages ST1 to STp are connected to their respective clock lines different from each other. Therefore, different clock signals are input to the first and second clock terminals CT1 and CT2 of each of the stages ST1 to STp. For example, as shown in FIG. 4A, the first clock terminal CT1 of the first stage ST1 is connected to the fifth clock line CL5, and its second clock terminal CT2 is connected to the sixth clock line CL6. In this case, the first clock terminal CT1 of the second stage ST2 is connected to the seventh clock line CL7, and its second clock terminal CT2 is connected to the eighth clock line CL8.

The clock signals are sequentially supplied to the first and second clock terminals CT1 and CT2 of the stages ST1 to STp. For example, as shown in FIG. 4A, the first clock terminal CT1 of the first stage ST1 is connected to the first clock dine CL1 to receive the first clock signal and its second clock terminal CT2 is connected to the second clock line CL2 to receive the second clock signal. The first clock terminal CT1 of the second stage ST2 is connected to the third clock dine CL3 to receive the third clock signal and its second clock terminal CT2 is connected to the fourth clock line CL4 to receive the fourth clock signal.

The first output terminal OT1 of each of the stages ST1 to STp is connected to odd numbered gate lines, and the output terminal OT2 thereof is connected to even numbered gate lines. For example, the first output terminal OT1 of the qth stage STq is connected to the 2q−1th gate line G2*q*-1, and the second output terminal thereof is connected to the second 2qth gate line 2*q*.

Each of the first and second dummy stages DST1 and DST2 are pulled-up by the start signal VST of the start signal line VSTL input to the first and second start terminals STE1 and STE2. Therefore, each of the first and second dummy stages DST1 and DST2 outputs the clock signal input to the first clock terminal CT1, to the first output terminal OT1 and outputs the clock signal input to the second clock terminal CT2, to the second output terminal OT2. The first and second dummy stages DST1 and DST2 are pulled-down by the output signals of the first and second output terminals OT1 and OT2 of the rear stage, which are input to the first and second reset terminals RT1 and RT2. As shown in FIG. 4A, the rear stage of the first dummy stage DST1 may be the first stage ST1, and the rear stage of the second dummy stage DST2 may be the second stage ST2. As shown in FIG. 4A, a signal may not be applied to the initialization terminal IT of the first and second dummy stages DST1 and DST2.

Each of the stages ST1 to STp is pulled-up by the output signals (front carry signals) of the first and second output terminals OT1 and OT2 of the rear stage, which are input to the first and second start terminals STE1 and STE2. Therefore, each of the stages ST1 to STp outputs the clock signal input to the first clock terminal CT1, to the first output terminal OT1 and outputs the clock signal input to the second clock terminal CT2, to the second output terminal OT2. As shown in FIG. 4A, the front stage of the first stage ST1 may be the first dummy stage DST1, and the front stage of the second stage ST2 may be the second dummy stage DST2. The rear stage of the qth stage STq except the first and second stages ST1 and ST2 may be the (q−2)th stage STq−2. Each of the stages ST1 to STp is pulled-down by the output signals of the first and second output terminals OT1 and OT2 of the rear stage, which are input to the first and second reset terminals RT1 and RT2. As shown in FIG. 4B, the rear stage of the (n−1)th stage STn−1 may be the third dummy stage DST3, and the rear stage of the nth stage STn may be the fourth dummy stage DST4. Each of the stages ST1 to STp may be initialized by being pulled-down by the start signal VST of the start signal line VSTL input to the initialization terminal IT.

Each of the third to sixth dummy stages DST3 to DST6 are pulled-up by the output signals of the first and second output terminals OT1 and OT2 of the rear stage, which are input to the first and second start terminals STE1 and STE2. Therefore, each of the third to sixth dummy stages DST3 to DST6 outputs the clock signal input to the first clock terminal CT1, to the first output terminal OT1 and outputs the clock signal input to the second clock terminal CT2, to the second output terminal OT2. As shown in FIG. 4B, the front stage of the third dummy stage DST3 may be the (n−1)th stage STn−1. The front stage of the fourth dummy stage DST4 may be the nth stage STn. The front stage of the fifth dummy stage DST5 may be the third dummy stage DST3. The front stage of the sixth dummy stage DST6 may be the fourth dummy stage DST4. The third and fourth dummy stages DST3 and DST3 are pulled-down by the output signals of the first and second output terminals OT1 and OT2 of the rear stage, which are input to the first and second reset terminals RT1 and RT2. As shown in FIG. 4*b*, the rear stage of the third dummy stage DST3 may be the fifth dummy stage DST5, and the rear stage of the fourth dummy stage DST4 may be the sixth dummy stage DST6. As shown in FIG. 4*b*, a signal may not be applied to the first and second reset terminals RT1 and RT2 of the fifth and sixth dummy stages DST5 and DST6. Each of the third to sixth dummy stages DST3 to DST6 may be initialized by being pulled-down by the start signal VST of the start signal line VSTL input to the initialization terminal IT.

As described above, the dummy stages DST1 to DST6 and the stages ST1 to STp of the gate driver 11 are sequentially pulled-up by the start signal VST of the start signal line VSTL to sequentially output the gate clock signals input to the clock terminals CT1 and CT2, thereby outputting the gate signals to the gate lines. That is, the start signal VST serves to allow the first and second dummy stages DST1 and DST2, the stages ST1 to STp and the third to sixth dummy stages DST3 to DST6 of the gate driver 11 to sequentially generate outputs. Also, the start signal VST serves as the initialization signal for initializing each of the stages ST1 to STp and the third to sixth dummy stages DST3 to DST6 to the pulled-down state.

Figure 5:
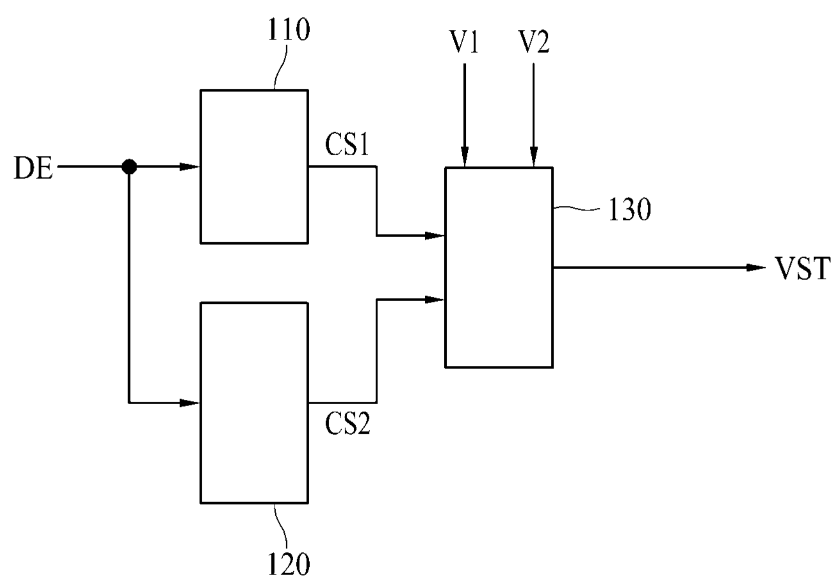
FIG. 5 illustrates a start signal output unit of a timing controller according to one embodiment.

FIG. 5 illustrates a start signal output unit of a timing controller according to one embodiment. Referring to FIG. 5, the timing controller 30 according to one embodiment includes a first counter 110, a second counter 120, and a start signal generator 130. The timing controller 30 outputs a start signal VST in accordance with a data enable signal DE by using the first counter 110, the second counter 120 and the start signal generator 130.

The first counter 110 receives the data enable signal DE. The first counter 110 counts a rising edge or falling edge of the data enable signal DE. The rising edge means a period where the data enable signal DE is increased from a first level voltage V1 to a second level voltage V2. The falling edge means a period where the data enable signal DE is dropped from the second level voltage V2 to the first level voltage V1. The first level voltage V1 may be 0V, and the second level voltage V2 may be 3.3V.

The first counter 110 may output a first count signal CS1 of the first level voltage V1 if a count value is smaller than a predetermined first value, and may output a second count signal CS2 of the second level voltage V2 if the count value is greater than the predetermined first value. The first counter 110 may initialize the count value simultaneously with a start of every frame period.

The second counter 120 receives the data enable signal DE, and counts the rising edge or falling edge of the data enable signal DE. The second counter 120 may output a second count signal CS2 of the first level voltage V1 if the count value is smaller than a predetermined second value, and may output a second count signal CS2 of the second level voltage V2 if the count value is greater than the predetermined second value. The second counter 120 may initialize the count value simultaneously with a start of every frame period.

Alternatively, the first counter 110 and the second counter 120 may receive a vertical synchronization signal Vsync instead of the data enable signal DE.

In this case, the first counter 110 counts a falling edge of the vertical synchronization signal Vsync. The falling edge indicates a time where the vertical synchronization signal Vsync is dropped from the second level voltage V2 to the first level voltage V1. The first counter 110 may output the first count signal CS1 of the first level voltage V1 if the count value is smaller than the predetermined first value, and may output the first count signal CS1 of the second level voltage V2 if the count value is greater than the predetermined first value. The first counter 110 may initialize the count value simultaneously with a start of every frame period.

The second counter 120 counts a rising edge of the vertical synchronization signal Vsync. The rising edge means a period where the vertical synchronization signal Vsync is increased from the first level voltage V1 to the second level voltage V2. The second counter 120 may output the second count signal CS2 of the first level voltage V1 if the count value is smaller than the predetermined second value, and may output the second count signal CS2 of the second level voltage V2 if the count value is greater than the predetermined second value. The second counter 120 may initialize the count value simultaneously with a start of every frame period.

The start signal generator 130 receives the first count signal CS1 from the first counter 110, and receives the second count signal CS2 from the second counter 120. The start signal generator 130 receives the first and second level voltages V1 and V2 from a power supply source (not shown).

The start signal generator 130 outputs the start signal VST of the first level voltage V1 if a first count signal VS1 of a first logic level voltage V1 is input thereto. The start signal generator 130 outputs the start signal VST of the second level voltage V2 if a first count signal VS1 of a second logic level voltage V2 is input thereto. The start signal generator 130 continues to output the start signal VST of the second level voltage V2 if a second count signal VS2 of the first logic level voltage V1 is input thereto while the first count signal VS1 of a second level voltage V2 is input thereto. The start signal generator 130 outputs the start signal VST of the first level voltage V1 if a second count signal VS2 of the second level voltage V2 is input thereto even though the first count signal VS1 of a second level voltage V2 is input thereto. The start signal VST that swings between the first level voltage V1 and the second level voltage V2 may be changed to swing between the gate low voltage VGL and the gate high voltage VGH as shown in FIG. 6 to FIGS. 9A and 9B through the level shifter 40 of FIG. 1.

As described above, the start signal VST may be generated based on the data enable signal DE. That is, in the start signal VST, the rising period from the gate low voltage VGL to the gate high voltage VGH and the falling period from the gate high voltage VGH to the gate low voltage VGL may be determined in accordance with the data enable signal DE.

FIGS. 6A and 6B are waveforms illustrating a data enable signal, image data input to a timing controller, image data output from the timing controller, a start signal, clock signals and VDD control signals according to a first embodiment.

An active period ACT and a vertical blank period VBI of an (N−1)th frame period and an active period ACT of an Nth frame period are shown in FIGS. 6A and 6B. In FIGS. 6A and 6B, for convenience of description, resolution of the display panel 10 has been described based on m×n. In this case, an active period of one frame period may include n number of horizontal periods.

Referring to FIGS. 6A and 6B, the data enable signal DE includes real data enable signals R1 to Rn generated for a period where valid data are input and dummy data enable signals D1 to Dx (where x is a positive integer of 2 or more) generated for a period where valid data are not input. One pulse period of the data enable signal may substantially be the same as one horizontal period.

Image data DI1 to DIn are input to the timing controller 30 by being synchronized with the rear data enable signals R1 to Rn. Image data DO1 to DOn are output from the timing controller 30 by being delayed by a predetermined horizontal period compared to the image data DI1 to DIn input to the timing controller 30. In FIGS. 6A and 6B, the image data DO1 to DOn output from the timing controller 30 are delayed by nine horizontal periods 9H compared to the image data DI1 to DIn input to the timing controller 30.

In the start signal VST, as described with reference to FIG. 5, the rising period from the gate low voltage VGL to the gate high voltage VGH and the falling period from the gate high voltage VGH to the gate low voltage VGL are determined in accordance with the data enable signal DE. Hereinafter, rising of the start signal VST from the gate low voltage VGL to the gate high voltage VGH at a rising edge of the first real data enable signal R1 of the Nth frame period. Also, falling of the start signal VST from the gate high voltage VGH to the gate low voltage VGL at a rising edge of the fourth real data enable signal R4 of the Nth frame period as shown in FIGS. 6A and 6B will be described in detail. In this case, the start signal VST shown in FIGS. 6A and 6B is the signal output from the start signal generator 130 of FIG. 5 when the first value of the first counter 110 of FIG. 5 is "1" and the second value of the second counter 120 is "4". In FIGS. 6A and 6B, a pulse width of the start signal VST corresponds to 3 horizontal periods 3H.

If the first value of the first counter 110 in FIG. 5 is "1", the first counter 110 may output the first count signal CS1 of the second level voltage V2 at the rising edge of the first real data enable signal R1 corresponding to the first data enable signal DE of the Nth frame period. The start signal generator 130 outputs the start signal VST of the second level voltage V2 if the first count signal CS1 of the second logic level voltage V2 is input thereto. The start signal VST of the second level voltage V2 is changed to the start signal VST of the gate high voltage VGH by the level shifter 40 of FIG. 1 and then output to the gate driver 11.

If the second value of the second counter 120 in FIG. 5 is "4", the second counter 120 may output the second count signal CS2 of the second level voltage V2 at the rising edge of the fourth real data enable signal R3 corresponding to the fourth data enable signal DE of the Nth frame period. The start signal generator 130 outputs the start signal VST of the first level voltage V1 if the second count signal CS2 of the second logic level voltage V2 is input thereto. The start signal VST of the second level voltage V2 is changed to the start signal VST of the gate high voltage VGH by the level shifter 40 of FIG. 1 and then output to the gate driver 11.

The gate clock signals GCLK1 to GCLK8 may be 8-phase clock signals of which phases are delayed sequentially. Each of the gate clock signals GCLK1 to GCLK8 may be generated as the gate high voltage VGH for four horizontal periods 4H as shown in FIGS. 6A and 6*b*, and may be generated as the gate low voltage VGL for four horizontal periods 4H. In this case, overlapped pulse widths of adjacent gate clock signals may correspond to three horizontal periods 3H as shown in FIGS. 6A and 6B. As described in FIGS. 4A and 4*b*, since the stages ST1 to STp output the gate clock signals, which are pulled-up by front carry signals and input sequentially, if the pulse widths of the adjacent gate clock signals are overlapped, the gate signals output to adjacent gate lines are also overlapped.

The gate clock signals GCLK1 to GCLK8 include dummy clock signals DCLK1 to DCLK4 supplied to the first and second dummy stages DST1 and DST2 of FIG. 4A at an initial period of the active period ACT of every frame period. Also, the gate clock signals GCLK1 to GCLK8 include dummy clock signals DCLK5 to DCLK12 supplied to the third to sixth dummy stages DST3 to DST6 of FIG. 4B at the last period of the active period ACT of every frame period and a vertical blank period VBI.

The first gate signal GS1 should be supplied by the data driver 20 in accordance with a timing of the first image data TO1 supplied as the first data voltage. That is, to match the first gate signal GS1 with the timing of the first data voltage, the gate clock signals GCLK1 to GCLK8 are set to be generated within several numbers of horizontal periods after the start signal VST is fallen from the gate high voltage VGH to the gate low voltage VGL as shown in FIGS. 6A and 6B.

A VDD control signal VDD_EO is the signal for supplying an odd VDD voltage for an odd frame period and controlling a supply of an even VDD voltage for an even frame period. Each of the stages ST1 to STp and the dummy stages DST1 to DST6 in FIGS. 4A and 4B receives any one of the odd VDD voltage and the even VDD voltage. In order to prevent a transistor included in the stages ST1 to STp and the dummy stages DST1 to DST6 of FIGS. 4A and 4B from being degraded by the VDD voltage, the odd VDD voltage is supplied for the odd frame period, and the even VDD voltage is supplied for the even frame period. The VDD control signal VDD_EO is generated as the gate low voltage VGL for the vertical blank period VBI of every frame period. The VDD control signal VDD_EO is generated as the gate low voltage VGL after a supply of the gate clock signals GCLK1 to GCLK8 is completed. If the supply of the gate clock signals GCLK1 to GCLK8 is completed, the gate clock signals GCLK1 to GCLK8 are generated as the gate low voltage VGL.

The reason why that the image data DO1 to DOn output from the timing controller 30 are delayed by nine horizontal periods 9H compared to the image data DI1 to Din input to the timing controller 30 in FIGS. 6A and 6B will be described in detail.

The start signal VST is generated as the gate high voltage VGH at an initial period of the active period ACT of every frame period. Therefore, the image data DO1 to DOn output from the timing controller 30 should be delayed by three horizontal periods 3H corresponding to the pulse width of the start signal VST compared to the image data DI1 to DIn input to the timing controller 30. Also, the pulse widths of the adjacent gate signals are overlapped to prevent a data voltage charging time in the display device of UHD from being reduced. For this reason, the image data DO1 to DOn output from the timing controller 30 should be delayed by three horizontal periods 3H corresponding to the overlapped pulse widths of the adjacent gate clock signals GCLK1 to GCLK8 compared to the image data DI1 to DIn input to the timing controller 30. Also, the image data DO1 to DOn output from the timing controller 30 should be delayed by four horizontal periods 4H for driving the first and second dummy stages DST1 and DST2 shown in FIG. 4A compared to the image data DI1 to DIn input to the timing controller 30. That is, the image data DO1 to DOn output from the timing controller 30 should be delayed by ten horizontal periods 10H compared to the image data DI1 to DIn input to the timing controller 30. Ten horizontal periods 10H may be obtained by adding up three horizontal periods 3H corresponding to the pulse width of the start signal VST, three horizontal periods 3H corresponding to the overlapped pulse widths of the adjacent gate clock signals GCLK1 to GCLK8 and four horizontal periods 4H for driving the first and second dummy stages DST1 and DST2.

However, the data driver 20 includes a line buffer for delaying one horizontal period 1H. Therefore, since one horizontal period 1H is delayed in the data driver 20, the image data DO1 to DOn output from the timing controller 30 is delayed by nine horizontal periods 9H compared to the image data DI1 to DIn input to the timing controller 30. That is, in the first embodiment, the image data DO1 to DOn output from the timing controller 30 should be delayed by nine horizontal periods 9H compared to the image data DI1 to DIn input to the timing controller 30. Therefore, data voltages may be output by being synchronized with the gate signal supplied to the first gate line G1 of FIG. 1.

The data voltages are supplied to pixels of one horizontal line for one horizontal period 1H. That is, the pixels of one horizontal line indicate those connected to the first gate line. A line memory indicates a memory for allowing the timing controller 30 to output image data, which will be supplied to the pixels of one horizontal line, by delaying the image data. Therefore, the timing controller 30 uses nine line memories to output the image data by delaying the image data by nine horizontal periods 9H. However, if the number of line memories is increased, the manufacturing cost of the display device due to increase of the cost of the parts, whereby it is beneficial to reduce the number of line memories. Hereinafter, a method for reducing the number of line memories will be described with reference to FIGS. 7A and 7B to FIGS. 9A and 9B.

Figure 7A:
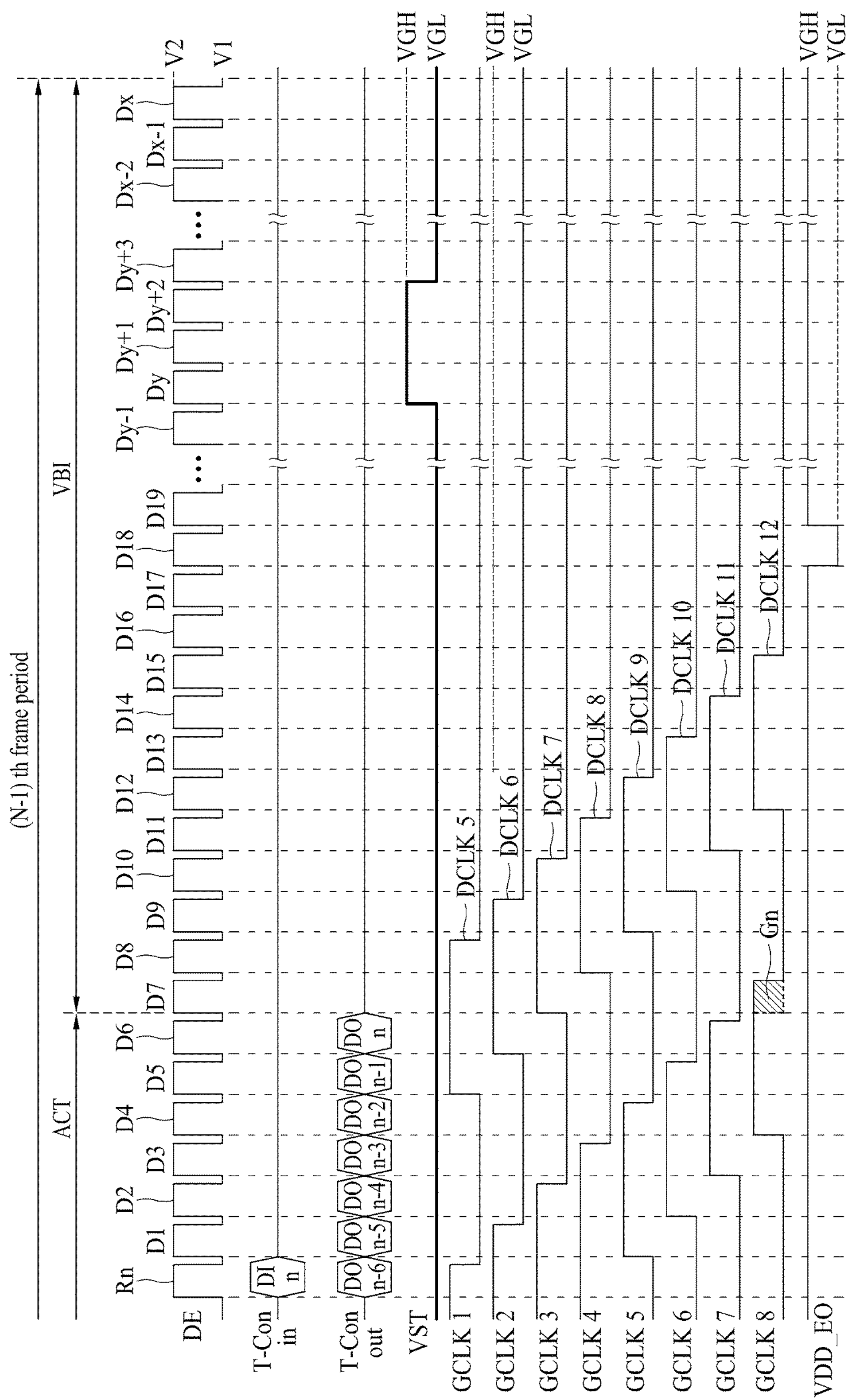
FIGS. 7A and 7B are waveforms illustrating a data enable signal, image data input to a timing controller, image data output from the timing controller, a start signal, clock signals and VDD control signals according to a second embodiment.
Figure 7B:
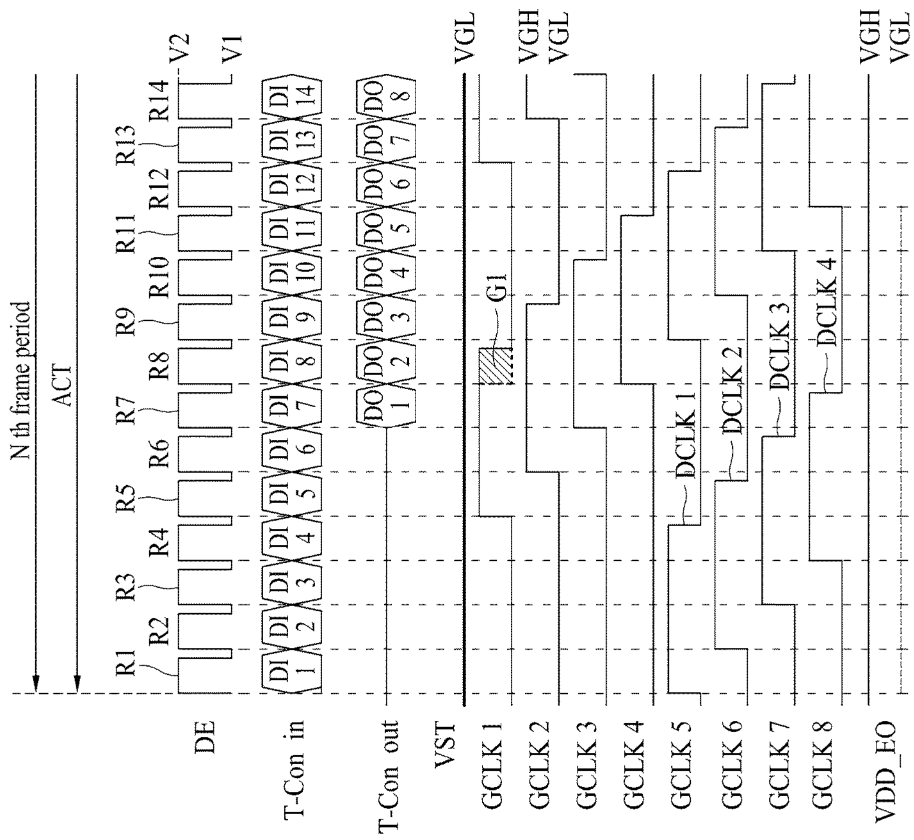

FIGS. 7A and 7B are waveforms illustrating a data enable signal, image data input to a timing controller, image data output from the timing controller, a start signal, clock signals and VDD control signals according to the second embodiment.

An active period ACT and a vertical blank period VBI of an (N−1)th frame period and an active period ACT of an Nth frame period are shown in FIGS. 7A and 7B. In FIGS. 7A and 7B, for convenience of description, resolution of the display panel 10 has been described based on m×n. In this case, an active period of one frame period may include n number of horizontal periods.

A data enable signal DE, gate clock signals GCLK1 to GCLK8 and a VDD control signal VDD_EO, which are shown in FIGS. 7A and 7B, are substantially the same as those shown in FIGS. 6A and 6B. Therefore, a detailed description of the data enable signal DE, the gate clock signals GCLK1 to GCLK8 and the VDD control signal VDD_EO, which are shown in FIGS. 7A and 7B, will be omitted.

Image data DI1 to Din are input to the timing controller 30 by being synchronized with the rear data enable signals R1 to Rn. Image data DO1 to DOn are output from the timing controller 30 by being delayed by a predetermined horizontal period compared to the image data DI1 to DIn input to the timing controller 30. In FIGS. 7A and 7*b*, the image data DO1 to DOn output from the timing controller 30 are delayed by six horizontal periods 6H compared to the image data DI1 to DIn input to the timing controller 30.

In the start signal VST, as described with reference to FIG. 5, the rising period from the gate low voltage VGL to the gate high voltage VGH and the falling period from the gate high voltage VGH to the gate low voltage VGL are determined in accordance with the data enable signal DE. Hereinafter, rising of the start signal VST from the gate low voltage VGL to the gate high voltage VGH at a rising edge of the yth dummy data enable signal Dy (y is a positive integer that satisfies 2≤y≤x−3) of the (N−1)th frame period as shown in FIGS. 7A and 7B will be described in detail. Also, falling of the start signal VST from the gate high voltage VGH to the gate low voltage VGL at a rising edge of the (y+3)th real data enable signal Dy+3 of the (N−1)th frame period as shown in FIGS. 7A and 7B will be described in detail. In this case, the start signal VST shown in FIGS. 7A and 7B is the signal output from the start signal generator 130 of FIG. 5 when the first value of the first counter 110 of FIG. 5 is "n+y" and the second value of the second counter 120 is "n+y+3". In FIGS. 7A and 7*b*, a pulse width of the start signal VST is three horizontal periods 3H.

If the first value of the first counter 110 in FIG. 5 is "n+y", the first counter 110 may output the first count signal CS1 of the second level voltage V2 at the rising edge of the yth dummy data enable signal Dy corresponding to the (n+y)th data enable signal DE of the (N−1)th frame period. The start signal generator 130 outputs the start signal VST of the second level voltage V2 if the first count signal CS1 of the second logic level voltage V2 is input thereto. The start signal VST of the second level voltage V2 is changed to the start signal VST of the gate high voltage VGH by the level shifter 40 of FIG. 1 and then output to the gate driver 11.

If the second value of the second counter 120 in FIG. 5 is "n+y+3", the second counter 120 may output the second count signal CS2 of the second level voltage V2 at the rising edge of the (y+3)th dummy data enable signal Dy+3 corresponding to the (n+y+3)th data enable signal DE of the (N−1)th frame period. The start signal generator 130 outputs the start signal VST of the second level voltage V2 if the second count signal CS2 of the second logic level voltage V2 is input thereto. The start signal VST of the second level voltage V2 is changed to the start signal VST of the gate high voltage VGH by the level shifter 40 of FIG. 1 and then output to the gate driver 11.

The reason why that the image data DO1 to DOn output from the timing controller 30 are delayed by six horizontal periods 6H compared to the image data DI1 to Din input to the timing controller 30 in FIGS. 7A and 7B will be described in detail.

The image data DO1 to DOn output from the timing controller 30 should be delayed by three horizontal periods 3H corresponding to the overlapped pulse widths of the adjacent gate clock signals GCLK1 to GCLK8 and four horizontal periods 4H for driving the first and second dummy stages DST1 and DST2 shown in FIG. 4A compared to the image data DI1 to DIn input to the timing controller 30. The delayed output of the image data DO1 to DOn in FIGS. 7A and 7B is substantially the same as that in FIGS. 6A and 6B. Also, in FIGS. 7A and 7B, the data driver 20 includes a line buffer for delaying one horizontal period 1H in the same manner as that described in FIGS. 6A and 6B.

However, in the first embodiment shown in FIGS. 6A and 6B, the start signal VST is generated as the gate high voltage VGH at the initial period of the active period ACT of every frame period. On the contrary, in the second embodiment shown in FIGS. 7A and 7B, the start signal VST is generated as the gate high voltage VGH within a vertical blank period VBI of every frame period. Therefore, if the start signal VST is generated as the gate high voltage VGH within the vertical blank period VBI as shown in FIGS. 7A and 7B, it is not required that the image data DO1 to DOn output from the timing controller 30 to be delayed more than the image data DI1 to DIn input to the timing controller 30. As a result, in the second embodiment, it is not required that the image data DO1 to DOn output from the timing controller 30 to be delayed by three horizontal periods 3H corresponding to the pulse width of the start signal VST. Therefore, the delayed output period of the image data DO1 to DOn output from the timing controller 30 may be reduced by three horizontal periods 3H, that is, from nine horizontal periods 9H to six horizontal periods 6H as compared with the image data DI1 to DIn input to the timing controller 30. That is, the image data DO1 to DOn output from the timing controller 30 are delayed by six horizontal periods 6H compared to the image data DI1 to DIn input to the timing controller 30.

As described above, in the first embodiment shown in FIGS. 6A and 6*b*, the timing controller 30 uses nine line memories to output the image data by delaying the image data by nine horizontal periods 9H. On the contrary, in the second embodiment shown in FIGS. 7A and 7B, the timing controller 30 outputs the image data by delaying the image data by six horizontal periods 6H, whereby six line memories are used. That is, in the second embodiment, the start signal VST may be generated as the gate high voltage VGH within the vertical blank period VBI, whereby three line memories may be reduced as compared with FIGS. 6A and 6B. For this reason, since the number of line memories may be reduced in the second embodiment as compared with the first embodiment, the manufacturing cost of the display device may be reduced.

Figure 8A:
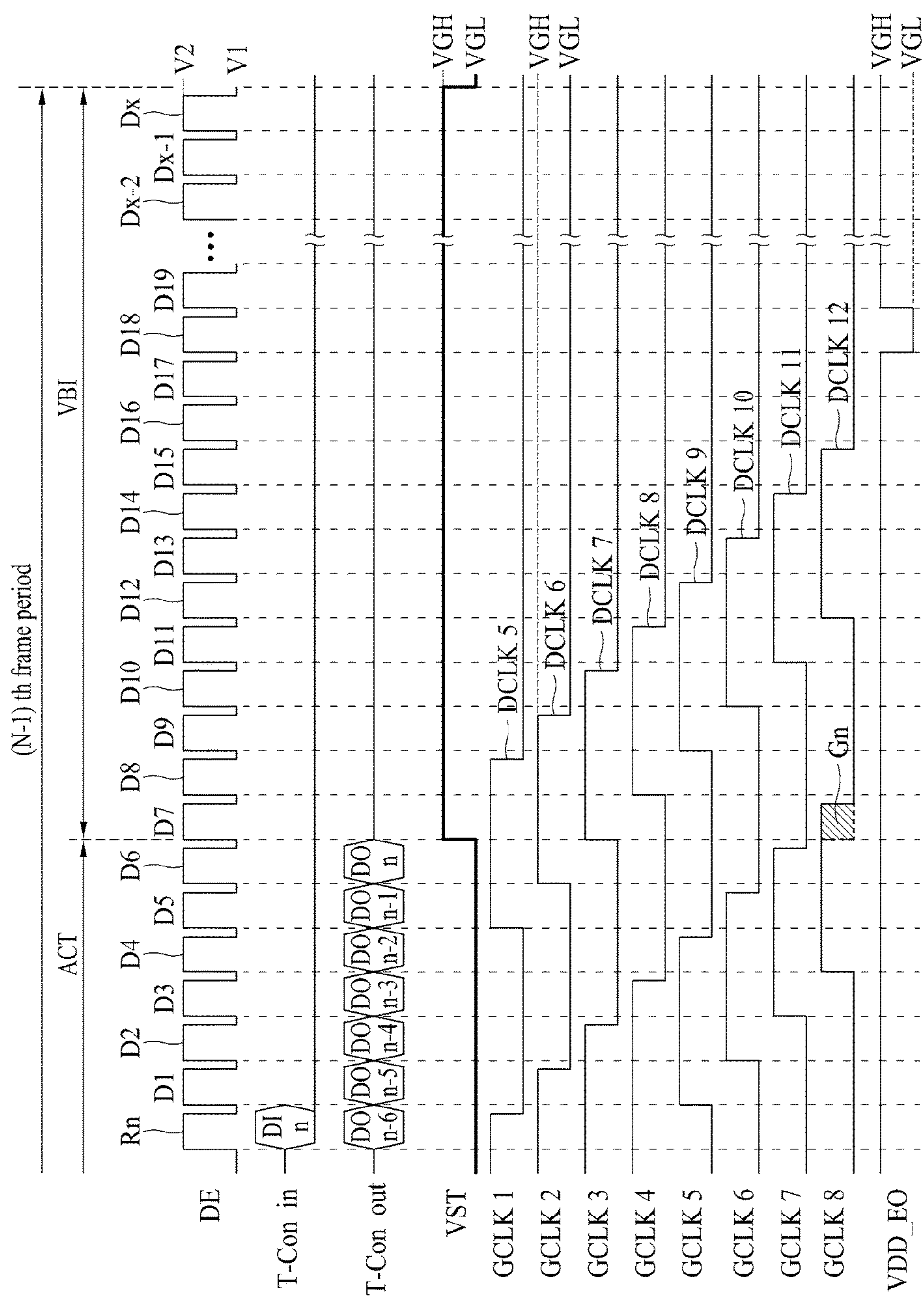
FIGS. 8A and 8B are waveforms illustrating a data enable signal, image data input to a timing controller, image data output from the timing controller, a start signal, clock signals and VDD control signals according to a third embodiment.
Figure 8B:
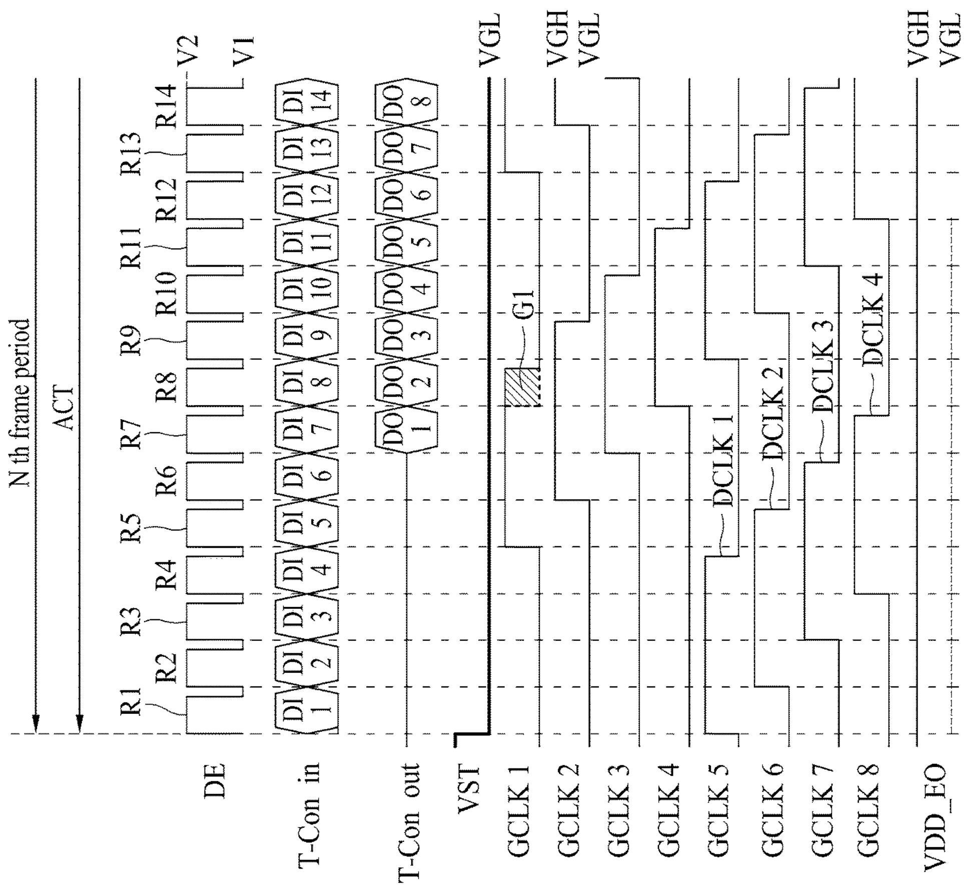

FIGS. 8A and 8B are waveforms illustrating a data enable signal, image data input to a timing controller, image data output from the timing controller, a start signal, clock signals and VDD control signals according to the third embodiment.

An active period ACT and a vertical blank period VBI of an (N−1)th frame period and an active period ACT of an Nth frame period are shown in FIGS. 8A and 8B. In FIGS. 8A and 8B, for convenience of description, resolution of the display panel 10 has been described based on m×n. In this case, an active period of one frame period may include n number of horizontal periods.

A data enable signal DE, gate clock signals GCLK1 to GCLK8 and a VDD control signal VDD_EO, which are shown in FIGS. 8A and 8B, are substantially the same as those shown in FIGS. 6A and 6B. Therefore, a detailed description of the data enable signal DE, the gate clock signals GCLK1 to GCLK8 and the VDD control signal VDD_EO, which are shown in FIGS. 8A and 8B, will be omitted.

A vertical synchronization signal Vsync is the signal indicating one frame period, and its period may substantially the same as one frame period. A period of the vertical synchronization signal Vsync having a first level voltage V1 is the vertical blank period VBI, A period of the vertical synchronization signal Vsync having a second level voltage V2 is the active period ACT.

Image data DI1 to Din are input to the timing controller 30 by being synchronized with the rear data enable signals R1 to Rn. Image data DO1 to DOn are output from the timing controller 30 by being delayed by a predetermined horizontal period compared to the image data DI1 to DIn input to the timing controller 30. In FIGS. 8A and 8B, the image data DO1 to DOn output from the timing controller 30 are delayed by six horizontal periods 6H compared to the image data DI1 to DIn input to the timing controller 30.

In the start signal VST, as described with reference to FIG. 5, the rising period from the gate low voltage VGL to the gate high voltage VGH and the falling period from the gate high voltage VGH to the gate low voltage VGL are determined in accordance with the vertical synchronization signal Vsync. Hereinafter, rising of the start signal VST from the gate low voltage VGL to the gate high voltage VGH at a falling edge of the vertical synchronization signal Vsync of the (N−1)th frame period as shown in FIGS. 8A and 8B will be described in detail. Also, falling of the start signal VST from the gate high voltage VGH to the gate low voltage VGL at a rising edge of the vertical synchronization signal Vsync of the Nth frame period as shown in FIGS. 8A and 8B will be described in detail. That is, in FIGS. 8A and 8B, the start signal VST is generated by being synchronized with the vertical blank period VBI. The start signal VST shown in FIGS. 8A and 8B is the signal output from the start signal generator 130 of FIG. 5 when the first value of the first counter 110 of FIG. 5 is "1" and the second value of the second counter 120 is "1". In FIGS. 8A and 8B, a pulse width of the start signal VST is determined depending on a length of the vertical blank period VBI.

If the first value of the first counter 110 in FIG. 5 is "1", the first counter 110 may output the first count signal CS1 of the second level voltage V2 at the falling edge of the vertical synchronization signal Vsync of the (N−1)th frame period. The start signal generator 130 outputs the start signal VST of the second level voltage V2 if the first count signal CS1 of the second logic level voltage V2 is input thereto. The start signal VST of the second level voltage V2 is changed to the start signal VST of the gate high voltage VGH by the level shifter 40 of FIG. 1 and then output to the gate driver 11.

If the second value of the second counter 120 in FIG. 5 is "1", the second counter 120 may output the second count signal CS2 of the second level voltage V2 at the rising edge of the vertical synchronization signal Vsync of the Nth frame period. The start signal generator 130 outputs the start signal VST of the first level voltage V1 if the second count signal CS2 of the second logic level voltage V2 is input thereto. The start signal VST of the second level voltage V2 is changed to the start signal VST of the gate high voltage VGH by the level shifter 40 of FIG. 1 and then output to the gate driver 11.

The reason why that the image data DO1 to DOn output from the timing controller 30 are delayed by six horizontal periods 6H compared to the image data DI1 to Din input to the timing controller 30 in FIGS. 8A and 8B will be described in detail.

The image data DO1 to DOn output from the timing controller 30 should be delayed by three horizontal periods 3H corresponding to the overlapped pulse widths of the adjacent gate clock signals GCLK1 to GCLK8 and four horizontal periods 4H for driving the first and second dummy stages DST1 and DST2 shown in FIG. 4A compared to the image data DI1 to DIn input to the timing controller 30. The delayed output of the image data DO1 to DOn in FIGS. 8A and 8B is substantially the same as that in FIGS. 6A and 6B. Also, in FIGS. 8A and 8B, the data driver 20 includes a line buffer for delaying one horizontal period 1H in the same manner as that described in FIGS. 6A and 6B.

However, in the first embodiment shown in FIGS. 6A and 6B, the start signal VST is generated as the gate high voltage VGH at the initial period of the active period ACT of every frame period. On the contrary, in the third embodiment shown in FIGS. 8A and 8B, the start signal VST is generated as the gate high voltage VGH by being synchronized with the vertical blank period VBI of every frame period. Therefore, if the start signal VST is generated as the gate high voltage VGH by being synchronized with the vertical blank period VBI as shown in FIGS. 8A and 8B, it is not required that the image data DO1 to DOn output from the timing controller 30 to be delayed more than the image data DI1 to DIn input to the timing controller 30. As a result, in the third embodiment, it is not required that the image data DO1 to DOn output from the timing controller 30 to be delayed by three horizontal periods 3H corresponding to the pulse width of the start signal VST. Therefore, the delayed output period of the image data DO1 to DOn output from the timing controller 30 may be reduced by three horizontal periods 3H, that is, from nine horizontal periods 9H to six horizontal periods 6H as compared with the image data DI1 to DIn input to the timing controller 30. That is, the image data DO1 to DOn output from the timing controller 30 are delayed by six horizontal periods 6H compared to the image data DI1 to DIn input to the timing controller 30.

As described above, in the first embodiment shown in FIGS. 6A and 6B, the timing controller 30 uses nine line memories to output the image data by delaying the image data by nine horizontal periods 9H. On the contrary, in the third embodiment shown in FIGS. 8A and 8B, the timing controller 30 outputs the image data by delaying the image data by six horizontal periods 6H, whereby six line memories are used. That is, in the third embodiment, the start signal VST may be generated as the gate high voltage VGH within the vertical blank period VBI, whereby three line memories may be reduced as compared with FIGS. 6A and 6B. For this reason, since the number of line memories may be reduced in the third embodiment as compared with the first embodiment, the manufacturing cost of the display device may be reduced.

Figure 9A:
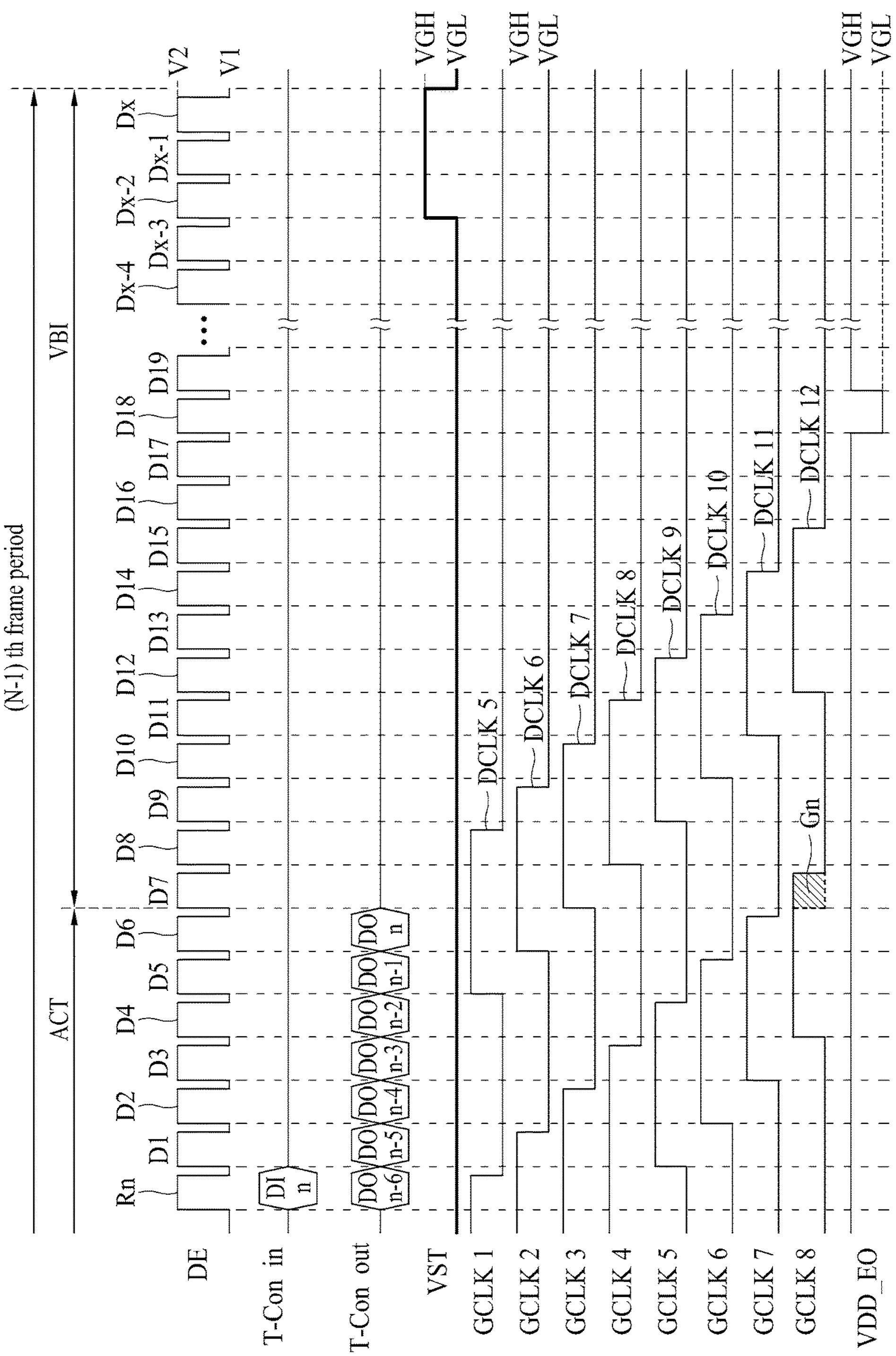
FIGS. 9A and 9B are waveforms illustrating a data enable signal, image data input to a timing controller, image data output from the timing controller, a start signal, clock signals and VDD control signals according to a fourth embodiment.
Figure 9B:
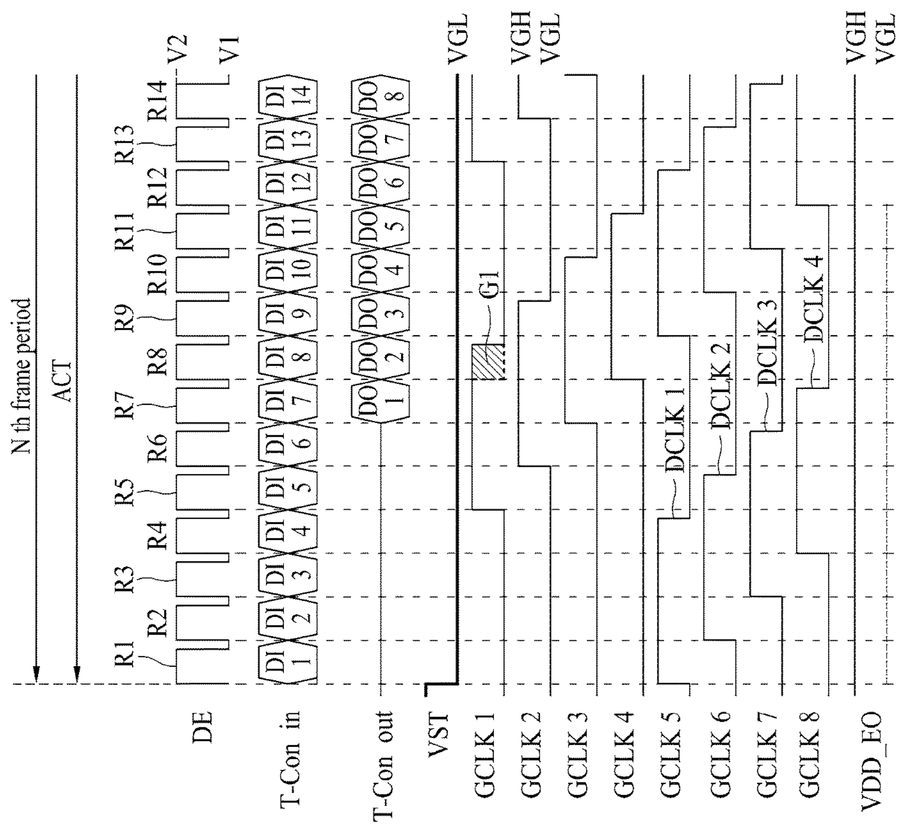

FIGS. 9A and 9B are waveforms illustrating a data enable signal, image data input to a timing controller, image data output from the timing controller, a start signal, clock signals and VDD control signals according to the fourth embodiment.

An active period ACT and a vertical blank period VBI of an (N−1)th frame period and an active period ACT of an Nth frame period are shown in FIGS. 9A and 9B. In FIGS. 9A and 9B, for convenience of description, resolution of the display panel 10 has been described based on m×n. In this case, an active period of one frame period may include n number of horizontal periods.

A data enable signal DE, gate clock signals GCLK1 to GCLK8 and a VDD control signal VDD_EO, which are shown in FIGS. 9A and 9B, are substantially the same as those shown in FIGS. 6A and 6B. Therefore, a detailed description of the data enable signal DE, the gate clock signals GCLK1 to GCLK8 and the VDD control signal VDD_EO, which are shown in FIGS. 9A and 9B, will be omitted.

Image data DI1 to Din are input to the timing controller 30 by being synchronized with the rear data enable signals R1 to Rn. Image data DO1 to DOn are output from the timing controller 30 by being delayed by a predetermined horizontal period compared to the image data DI1 to DIn input to the timing controller 30. In FIGS. 9A and 9B, the image data DO1 to DOn output from the timing controller 30 are delayed by six horizontal periods 6H compared to the image data DI1 to DIn input to the timing controller 30.

In the start signal VST, as described with reference to FIG. 5, the rising period from the gate low voltage VGL to the gate high voltage VGH and the falling period from the gate high voltage VGH to the gate low voltage VGL are determined in accordance with the data enable signal DE. Hereinafter, rising of the start signal VST from the gate low voltage VGL to the gate high voltage VGH at a rising edge of the (x−u)th dummy data enable signal Dx−u (u is a positive integer smaller than x) of the (N−1)th frame period as shown in FIGS. 9A and 9B will be described in detail. Also, falling of the start signal VST from the gate high voltage VGH to the gate low voltage VGL at a rising edge of the first real data enable signal R1 of the Nth frame period as shown in FIGS. 9A and 9B will be described in detail. Hereinafter, for convenience of description, the fourth embodiment will be described based on that u is 3. The start signal VST shown in FIGS. 9A and 9B is the signal output from the start signal generator 130 of FIG. 5 when the first value of the first counter 110 of FIG. 5 is "n+x−3" and the second value of the second counter 120 is "1". In FIGS. 9A and 9B, a pulse width of the start signal VST is three horizontal periods 3H.

If the first value of the first counter 110 in FIG. 5 is "n+x−3", the first counter 110 may output the first count signal CS1 of the second level voltage V2 at the rising edge of the x−3th dummy data enable signal Dx−3 corresponding to the (n+x−3)th data enable signal DE of the (N−1)th frame period. The start signal generator 130 outputs the start signal VST of the second level voltage V2 if the first count signal CS1 of the second logic level voltage V2 is input thereto. The start signal VST of the second level voltage V2 is changed to the start signal VST of the gate high voltage VGH by the level shifter 40 of FIG. 1 and then output to the gate driver 11.

If the second value of the second counter 120 in FIG. 5 is "1", the second counter 120 may output the second count signal CS2 of the second level voltage V2 at the rising edge of the first real data enable signal R1 corresponding to the first data enable signal DE of the Nth frame period. The start signal generator 130 outputs the start signal VST of the first level voltage V1 if the second count signal CS2 of the second logic level voltage V2 is input thereto. The start signal VST of the second level voltage V2 is changed to the start signal VST of the gate high voltage VGH by the level shifter 40 of FIG. 1 and then output to the gate driver 11.

The reason why that the image data DO1 to DOn output from the timing controller 30 are delayed by six horizontal periods 6H compared to the image data DI1 to Din input to the timing controller 30 in FIGS. 9A and 9B will be described in detail.

The image data DO1 to DOn output from the timing controller 30 should be delayed by three horizontal periods 3H corresponding to the overlapped pulse widths of the adjacent gate clock signals GCLK1 to GCLK8 and four horizontal periods 4H for driving the first and second dummy stages DST1 and DST2 shown in FIG. 4A compared to the image data DI1 to DIn input to the timing controller 30. The delayed output of the image data DO1 to DOn in FIGS. 9A and 9B is substantially the same as that in FIGS. 6A and 6B. Also, in FIGS. 9A and 9B, the data driver 20 includes a line buffer for delaying one horizontal period 1H in the same manner as that described in FIGS. 6A and 6B.

However, in the first embodiment shown in FIGS. 6A and 6B, the start signal VST is generated as the gate high voltage VGH at the initial period of the active period ACT of every frame period. On the contrary, in the fourth embodiment shown in FIGS. 9A and 9*b*, the start signal VST is generated as the gate high voltage VGH within a vertical blank period VBI of every frame period. Therefore, if the start signal VST is generated as the gate high voltage VGH by synchronization within the vertical blank period VBI as shown in FIGS. 9A and 9*b*, it is not required that the image data DO1 to DOn output from the timing controller 30 to be delayed more than the image data DI1 to DIn input to the timing controller 30. As a result, in the fourth embodiment, it is not required that the image data DO1 to DOn output from the timing controller 30 to be delayed by three horizontal periods 3H corresponding to the pulse width of the start signal VST. Therefore, the delayed output period of the image data DO1 to DOn output from the timing controller 30 may be reduced by three horizontal periods 3H, that is, from nine horizontal periods 9H to six horizontal periods 6H as compared with the image data DI1 to DIn input to the timing controller 30. That is, the image data DO1 to DOn output from the timing controller 30 are delayed by six horizontal periods 6H compared to the image data DI1 to DIn input to the timing controller 30.

As described above, in the first embodiment shown in FIGS. 6A and 6B, the timing controller 30 uses nine line memories to output the image data by delaying the image data by nine horizontal periods 9H. On the contrary, in the fourth embodiment shown in FIGS. 9A and 9B, the timing controller 30 outputs the image data by delaying the image data by six horizontal periods 6H, whereby six line memories are used. That is, in the fourth embodiment, the start signal VST may be generated as the gate high voltage VGH within the vertical blank period VBI, whereby three line memories may be reduced as compared with FIGS. 6A and 6B. For this reason, since the number of line memories may be reduced in the fourth embodiment as compared with the first embodiment, the manufacturing cost of the display device may be reduced.

Figure 10A:
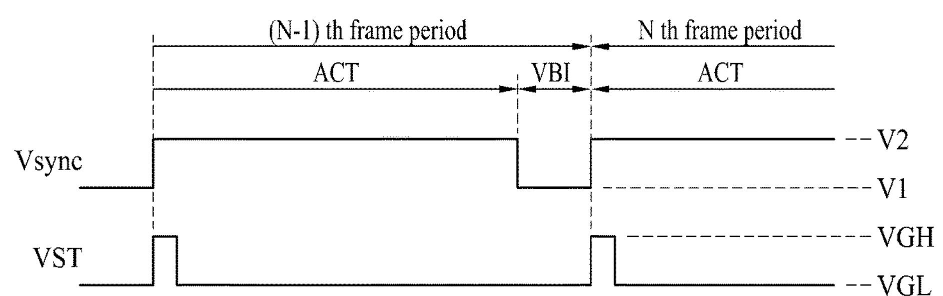
FIGS. 10A and 10B illustrate examples of a vertical synchronization signal, an active period, a vertical blank period and a start signal for a first and second frequencies according to the first embodiment.
Figure 10B:
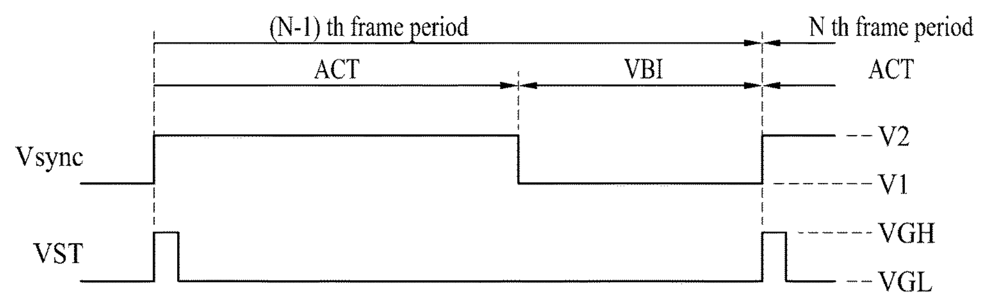

FIGS. 10A and 10B illustrate examples of a vertical synchronization signal, an active period, a vertical blank period and a start signal in case of first and second frequencies according to the first embodiment. FIG. 10A illustrates a vertical synchronization signal, an active period, a vertical blank period and a start signal when the first frequency is 60 Hz, and FIG. 10B illustrates a vertical synchronization signal, an active period, a vertical blank period and a start signal when the second frequency is 40 Hz.

The second frequency is lower than the first frequency by increasing a length of the vertical blank period VBI while maintaining the active period ACT to be the same as that of the first frequency. The technology for reducing the frequency by increasing the length of the vertical blank period VBI while maintaining the active period ACT is known as an adaptive sync technology. The adaptive sync technology is to obtain a data processing time if more data to be processed by a graphic card or host system exist. For convenience of description, an active period ACT, a vertical blank period VBI and a start signal VST of each of the (N−1)th and Nth frame periods are only shown in FIGS. 10A and 10B.

Referring to FIGS. 10A and 10B, in the first embodiment, the start signal VST is generated as the gate high voltage VGH at an initial period of the active period ACT of every frame period. Also, in the first embodiment, since the start signal VST is supplied in accordance with the data enable signal DE, a pulse width of the start signal VST is not varied regardless of frequency variation according to the adaptive sync. Therefore, the pulse width of the start signal VST may be set substantially equally for both of the case where the display panel 10 is driven by the first frequency and the case where the display panel 10 is driven by the second frequency.

The first embodiment is not affected by variation of the length of the vertical blank period VBI according to the first and second frequencies. In more detail, the start signal VST serves as an initialization signal for initializing stages ST1 to STp and third to sixth dummy stages DST3 to DST6 to a pulled-down state as well as a signal for starting the output of the gate driver 11. Therefore, after gate clock signals GCLK1 to GCLK8 and VDD control signal VDD_EO for controlling the output of the gate driver 11 for the (N−1)th frame period are supplied, it is preferable that the start signal VST for controlling the output of the gate driver 11 for the Nth frame period is supplied. Otherwise, before at least one of the third to sixth dummy stages DST3 to DST6 for generating the output for the vertical blank period VBI of the (N−1)th frame period is pulled-up to generate the output, the start signal VST is supplied as the initialization signal and then initialized by being pulled-down. In this case, stages for receiving rear carry signals through the third to sixth dummy stages DST3 to DST6, for example, p−1th to pth stages STp−1 to STp of FIG. 4B abnormally output gate signals to gate lines, whereby a problem may occur in that picture quality of the display device is deteriorated.

According to the first embodiment, the gate clock signals GCLK1 to GCLK8 and VDD control signal VDD_EO for controlling the output of the gate driver 11 for the (N−1)th frame period are completely supplied for the vertical blank period VBI of the (N−1)th frame period. And then, the start signal VST for controlling the output of the gate driver 11 for the Nth frame period is supplied at the initial period of the active period ACT of the Nth frame period. Therefore, in the first embodiment, the problem that picture quality of the display device is deteriorated as the p−1th to pth stages STp−1 to STp of FIG. 4B abnormally output gate signals to gate lines does not occur.

Also, the first gate signal GS1 should be supplied by the data driver 20 in accordance with a timing of the first image data TO1 supplied as the first data voltage. That is, to match the first gate signal GS1 with the timing of the first data voltage, the gate clock signals GCLK1 to GCLK8 are set to be generated within several numbers of horizontal periods after the start signal VST is fallen from the gate high voltage VGH to the gate low voltage VGL as shown in FIGS. 6A and 6B. Therefore, if an interval between the start signal VST and the active period ACT is increased as the length of the vertical blank period VBI is varied by the adaptive sync, a problem may occur in that the first gate signal GS1 is not synchronized with the timing of the first data voltage. In this case, picture quality of the display device is deteriorated.

In the first embodiment, since there is no change in the interval between the start signal VST and the active period ACT even though the vertical blank period VBI is increased as shown in FIG. 10B by the adaptive sync, the problem that the first gate signal GS1 is not synchronized with the timing of the first data voltage does not occur.

As described above, in the first embodiment, after the gate clock signals GCLK1 to GCLK8 and VDD control signal VDD_EO for controlling the output of the gate driver 11 for the (N−1)th frame period are supplied, the start signal VST for controlling the output of the gate driver 11 for the Nth frame period is supplied. Therefore, in the first embodiment, even though the frequency is changed by the adaptive sync, the problem that picture quality of the display device is deteriorated does not occur. Also, in the first embodiment, since there is no change in the interval between the start signal VST and the active period ACT even though the frequency is varied by the adaptive sync, the problem that the first gate signal GS1 is not synchronized with the timing of the first data voltage does not occur.

Figure 11A:
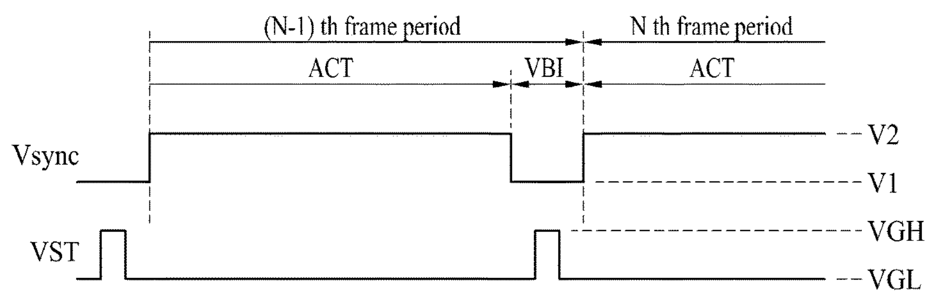
FIGS. 11A and 11B illustrate examples of a vertical synchronization signal, an active period, a vertical blank period and a start signal for a first and second frequencies according to the second embodiment.
Figure 11B:
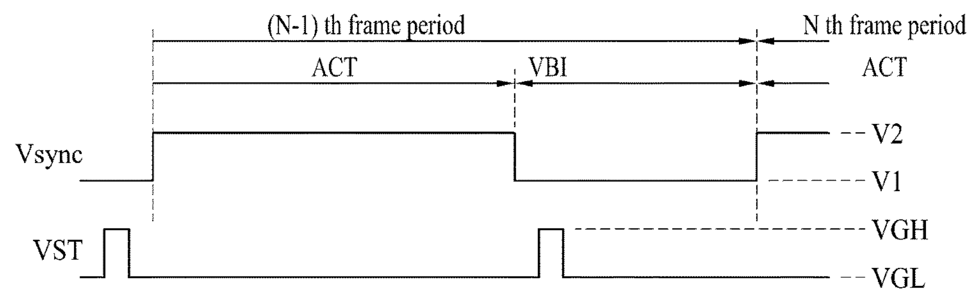

FIGS. 11A and 11B illustrate examples of a vertical synchronization signal, an active period, a vertical blank period and a start signal in case of first and second frequencies according to the second embodiment. FIG. 11A illustrates a vertical synchronization signal, an active period, a vertical blank period and a start signal when the first frequency is 60 Hz, and FIG. 11B illustrates a vertical synchronization signal, an active period, a vertical blank period and a start signal when the second frequency is 40 Hz.

The second frequency is lower than the first frequency by increasing a length of the vertical blank period VBI while maintaining the active period ACT to be the same as that of the first frequency. The technology for reducing the frequency by increasing the length of the vertical blank period VBI while maintaining the active period ACT is known as an adaptive sync technology. For convenience of description, an active period ACT, a vertical blank period VBI and a start signal VST of each of the (N−1)th and Nth frame periods are only shown in FIGS. 11A and 11B.

Referring to FIGS. 11A and 11B, in the second embodiment, the start signal VST is generated as the gate high voltage VGH within the vertical blank period VBI of every frame period. Also, in the second embodiment, since the start signal VST is supplied in accordance with the data enable signal DE, a pulse width of the start signal VST is not varied regardless of frequency variation according to the adaptive sync. Therefore, the pulse width of the start signal VST may be set substantially equally for both of the case where the display panel 10 is driven by the first frequency and the case where the display panel 10 is driven by the second frequency.

The second embodiment is not affected by variation of the length of the vertical blank period VBI according to the first and second frequencies. In more detail, the start signal VST serves as an initialization signal for initializing stages ST1 to STp and third to sixth dummy stages DST3 to DST6 to a pulled-down state as well as a signal for starting the output of the gate driver 11. Therefore, after gate clock signals GCLK1 to GCLK8 and VDD control signal VDD_EO for controlling the output of the gate driver 11 for the (N−1)th frame period are supplied, it is preferable that the start signal VST for controlling the output of the gate driver 11 for the Nth frame period is supplied. Otherwise, before at least one of the third to sixth dummy stages DST3 to DST6 for generating the output for the vertical blank period VBI of the (N−1)th frame period is pulled-up to generate the output, the start signal VST is supplied as the initialization signal and then initialized by being pulled-down. In this case, stages for receiving rear carry signals through the third to sixth dummy stages DST3 to DST6, for example, p−1th to pth stages STp−1 to STp of FIG. 4B abnormally output gate signals to gate lines, whereby a problem may occur in that picture quality of the display device is deteriorated.

According to the second embodiment, the gate clock signals GCLK1 to GCLK8 and VDD control signal VDD_EO for controlling the output of the gate driver 11 for the (N−1)th frame period are completely supplied for the vertical blank period VBI of the (N−1)th frame period. And then, the start signal VST for controlling the output of the gate driver 11 for the Nth frame period is supplied within the vertical blank period VBI of the (N−1)th frame period. Therefore, in the second embodiment, the problem that picture quality of the display device is deteriorated as the p−1th to pth stages STp−1 to STp abnormally output gate signals to gate lines does not occur.

Also, the first gate signal GS1 should be supplied by the data driver 20 in accordance with a timing of the first image data TO1 supplied as the first data voltage. That is, to match the first gate signal GS1 with the timing of the first data voltage, the gate clock signals GCLK1 to GCLK8 are set to be generated within several numbers of horizontal periods after the start signal VST is fallen from the gate high voltage VGH to the gate low voltage VGL as shown in FIGS. 6A and 6B. Therefore, if an interval between the start signal VST and the active period ACT is varied as the length of the vertical blank period VBI is varied by the adaptive sync, a problem may occur in that the first gate signal GS1 is not synchronized with the timing of the first data voltage. In this case, picture quality of the display device is deteriorated.

In the second embodiment, if the vertical blank period VBI is increased as shown in FIG. 11B by the adaptive sync, the interval between the start signal VST and the active period ACT is increased. Therefore, a problem may occur in that the first gate signal GS1 is not synchronized with the timing of the first data voltage. Therefore, picture quality of the display device may be deteriorated.

As described above, in the second embodiment, the gate clock signals GCLK1 to GCLK8 and VDD control signal VDD_EO for controlling the output of the gate driver 11 for the (N−1)th frame period are supplied. And then, the start signal VST for controlling the output of the gate driver 11 for the Nth frame period is supplied. Therefore, in the second embodiment, even though the frequency is varied by the adaptive sync, the problem that picture quality of the display device is deteriorated does not occur. However, in the second embodiment, since the interval between the start signal VST and the active period ACT is increased if the frequency is varied by the adaptive sync, the problem may occur in that the first gate signal GS1 is not synchronized with the timing of the first data voltage. Therefore, it is preferable that the second embodiment is not applied to the display device that includes the adaptive sync technology.

Figure 12A:
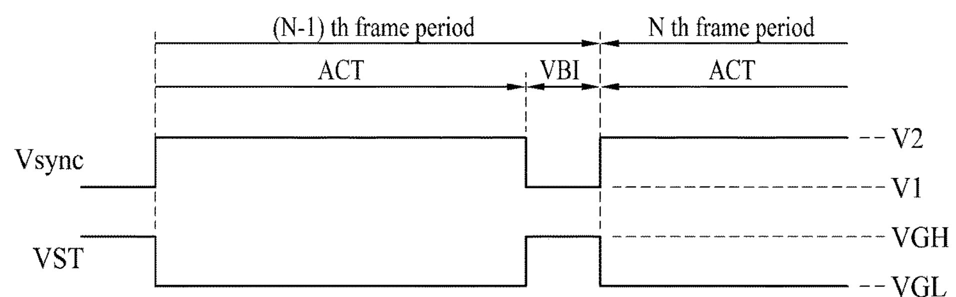
FIGS. 12A and 12B illustrate examples of a vertical synchronization signal, an active period, a vertical blank period and a start signal for a first and second frequencies according to the third embodiment.
Figure 12B:
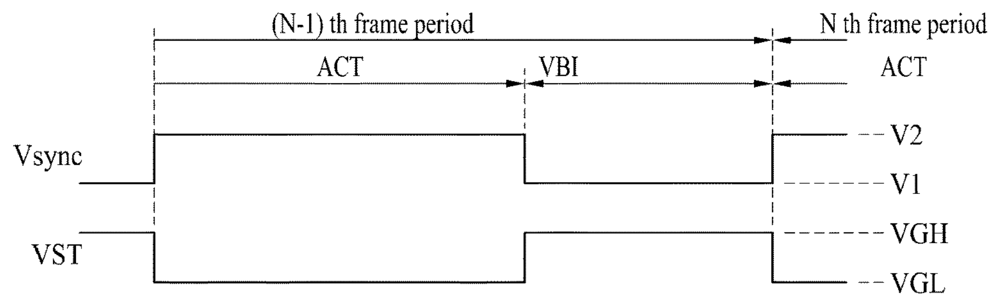

FIGS. 12A and 12B illustrate examples of a vertical synchronization signal, an active period, a vertical blank period and a start signal in case of first and second frequencies according to the third embodiment. FIG. 12A illustrates a vertical synchronization signal, an active period, a vertical blank period and a start signal when the first frequency is 60 Hz, and FIG. 12B illustrates a vertical synchronization signal, an active period, a vertical blank period and a start signal when the second frequency is 40 Hz.

The second frequency is lower than the first frequency by increasing a length of the vertical blank period VBI while maintaining the active period ACT to be the same as that of the first frequency. The technology for reducing the frequency by increasing the length of the vertical blank period VBI while maintaining the active period ACT is known as an adaptive sync technology. For convenience of description, an active period ACT, a vertical blank period VBI and a start signal VST of each of the (N−1)th and Nth frame periods are only shown in FIGS. 12A and 12B.

Referring to FIGS. 12A and 12B, in the third embodiment, the start signal VST is generated as the gate high voltage VGH by being synchronized with the vertical blank period VBI of every frame period. For this reason, in the third embodiment, a pulse width of the start signal VST is changed depending on the case where the display panel 10 is driven by the first frequency and the case where the display panel 10 is driven by the second frequency.

Also, in the third embodiment, the pulse width of the start signal VST is varied if the frequency is varied in accordance with the adaptive sync. In more detail, in the third embodiment, the start signal VST is generated as the gate high voltage VGH at a falling edge of a vertical synchronization signal vsync of the vertical blank period VBI of the (N−1)th frame period. Also, the start signal VST is generated as the gate low voltage VGH at a rising edge of a vertical synchronization signal vsync of the active period ACT of the Nth frame period. The interval between the falling edge and the rising edge of the vertical synchronization signal vsync is more increased in case of the second frequency than the first frequency as shown in FIGS. 12A and 12B in accordance with frequency variation according to the adaptive sync. Therefore, the pulse width of the start signal VST when the display panel 10 is driven by the second frequency is wider than that of the start signal VST when the display panel 10 is driven by the first frequency.

The third embodiment is affected by variation of the length of the vertical blank period VBI according to the first and second frequencies. In more detail, the start signal VST serves as an initialization signal for initializing stages ST1 to STp and third to sixth dummy stages DST3 to DST6 to a pulled-down state as well as a signal for starting the output of the gate driver 11. Therefore, after gate clock signals GCLK1 to GCLK8 and VDD control signal VDD_EO for controlling the output of the gate driver 11 for the (N−1)th frame period are supplied, it is preferable that the start signal VST for controlling the output of the gate driver 11 for the Nth frame period is supplied. Otherwise, before at least one of the third to sixth dummy stages DST3 to DST6 for generating the output for the vertical blank period VBI of the (N−1)th frame period is pulled-up to generate the output, the start signal VST is supplied as the initialization signal and then initialized by being pulled-down. In this case, stages for receiving rear carry signals through the third to sixth dummy stages DST3 to DST6, for example, p−1th to pth stages STp−1 to STp of FIG. 4B abnormally output gate signals to gate lines, whereby a problem may occur in that picture quality of the display device is deteriorated.

According to the third embodiment, the gate clock signals GCLK1 to GCLK8 and VDD control signal VDD_EO for controlling the output of the gate driver 11 for the (N−1)th frame period are completely supplied for the vertical blank period VBI of the (N−1)th frame period. And then, the start signal VST for controlling the output of the gate driver 11 for the Nth frame period is supplied by being synchronized with the vertical blank period VBI of the (N−1)th frame period. For this reason, in the third embodiment, before the third to sixth dummy stages DST3 to DST6 are pulled-up to generate the output, the start signal VST is supplied as the initialization signal and then initialized by being pulled-down. Therefore, the stages for receiving rear carry signals through the third to sixth dummy stages DST3 to DST6, for example, the p−1th to pth stages STp−1 to STp of FIG. 4B abnormally output gate signals to gate lines, whereby the problem may occur in that picture quality of the display device is deteriorated.

Also, the first gate signal GS1 should be supplied by the data driver 20 in accordance with a timing of the first image data TO1 supplied as the first data voltage. That is, to match the first gate signal GS1 with the timing of the first data voltage, the gate clock signals GCLK1 to GCLK8 are set to be generated within several numbers of horizontal periods after the start signal VST is fallen from the gate high voltage VGH to the gate low voltage VGL as shown in FIGS. 6A and 6B. Therefore, if an interval between the start signal VST and the active period ACT is increased as the length of the vertical blank period VBI is varied by the adaptive sync, a problem may occur in that the first gate signal GS1 is not synchronized with the timing of the first data voltage. In this case, picture quality of the display device is deteriorated.

In the third embodiment, there is no change in the interval between the start signal VST and the active period ACT even though the vertical blank period VBI is increased as shown in FIG. 12B by the adaptive sync. Therefore, the problem that the first gate signal GS1 is not synchronized with the timing of the first data voltage does not occur.

As described above, in the third embodiment, there is no change in the interval between the start signal VST and the active period ACT even though the frequency is varied by the adaptive sync. Therefore, the problem that the first gate signal GS1 is not synchronized with the timing of the first data voltage does not occur. However, in the third embodiment, before the gate clock signals GCLK1 to GCLK8 and VDD control signal VDD_EO for controlling the output of the gate driver 11 for the (N−1)th frame period are supplied, the start signal VST for controlling the output of the gate driver 11 for the Nth frame period is supplied. Therefore, in the third embodiment, if the frequency is varied by the adaptive sync, the problem may occur in that picture quality of the display device is deteriorated. In this respect, in the third embodiment, it is preferable that the third embodiment is not applied to the display device that includes the adaptive sync technology.

Figure 13A:
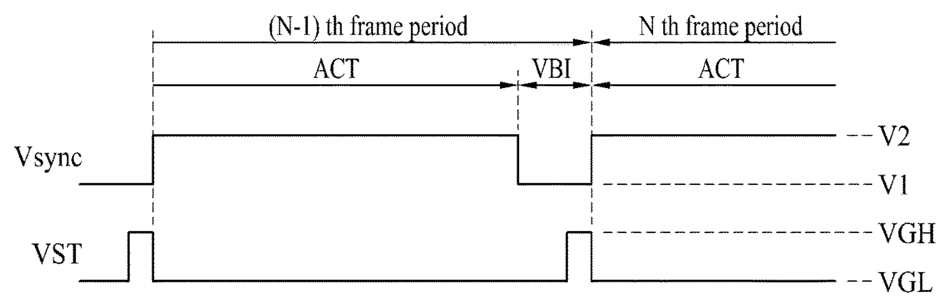
FIGS. 13A and 13B illustrate examples of a vertical synchronization signal, an active period, a vertical blank period and a start signal for a first and second frequencies according to the fourth embodiment.
Figure 13B:
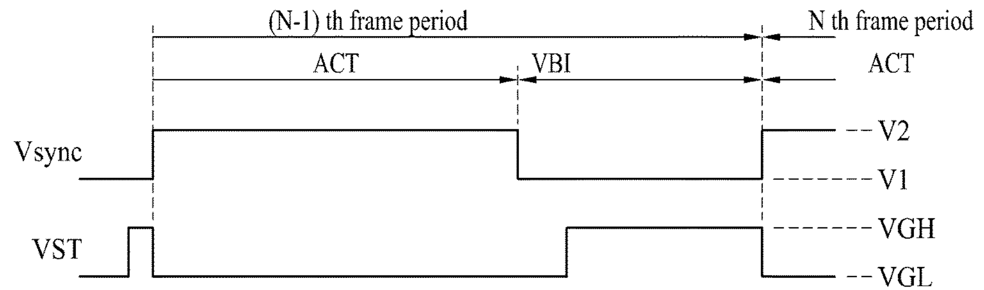

FIGS. 13A and 13B illustrate examples of a vertical synchronization signal, an active period, a vertical blank period and a start signal in case of first and second frequencies according to the fourth embodiment. FIG. 13A illustrates a vertical synchronization signal, an active period, a vertical blank period and a start signal when the first frequency is 60 Hz, and FIG. 13B illustrates a vertical synchronization signal, an active period, a vertical blank period and a start signal when the second frequency is 40 Hz.

The second frequency is lower than the first frequency by increasing a length of the vertical blank period VBI while maintaining the active period ACT to be the same as that of the first frequency. The technology for reducing the frequency by increasing the length of the vertical blank period VBI while maintaining the active period ACT is known as an adaptive sync technology. For convenience of description, an active period ACT, a vertical blank period VBI and a start signal VST of each of the (N−1)th and Nth frame periods are only shown in FIGS. 13A and 13B.

Referring to FIGS. 13A and 13B, in the fourth embodiment, the start signal VST is generated as the gate high voltage VGH within the vertical blank period VBI of every frame period. Also, in the fourth embodiment, a pulse width of the start signal VST is varied if the frequency is varied in accordance with the adaptive sync. In more detail, in the fourth embodiment, the start signal VST is generated as the gate high voltage VGH at a rising edge of a (x−3)th dummy data enable signal Dx−3 of the vertical blank period VBI of the (N−1)th frame period. Also, the start signal VST is generated as the gate low voltage VGH at a rising edge of a first real data enable signal R1 of the active period ACT of the Nth frame period. The interval between the (x−3)th dummy data enable signal Dx−3 and the first real data enable signal R1 is more increased in case of the second frequency than the first frequency as shown in FIGS. 13A and 13B in accordance with frequency variation according to the adaptive sync. Therefore, the pulse width of the start signal VST when the display panel 10 is driven by the second frequency is wider than that of the start signal VST when the display panel 10 is driven by the first frequency.

Therefore, the pulse width of the start signal VST may be set substantially equally for both of the case where the display panel 10 is driven by the first frequency and the case where the display panel 10 is driven by the second frequency.

The fourth embodiment is not affected by variation of the length of the vertical blank period VBI according to the first and second frequencies. In more detail, the start signal VST serves as an initialization signal for initializing stages ST1 to STp and third to sixth dummy stages DST3 to DST6 to a pulled-down state as well as a signal for starting the output of the gate driver 11. Therefore, after gate clock signals GCLK1 to GCLK8 and VDD control signal VDD_EO for controlling the output of the gate driver 11 for the (N−1)th frame period are supplied, it is preferable that the start signal VST for controlling the output of the gate driver 11 for the Nth frame period is supplied. Otherwise, before at least one of the third to sixth dummy stages DST3 to DST6 for generating the output for the vertical blank period VBI of the (N−1)th frame period is pulled-up to generate the output, the start signal VST is supplied as the initialization signal and then initialized by being pulled-down. In this case, stages for receiving rear carry signals through the third to sixth dummy stages DST3 to DST6, for example, p−1th to pth stages STp−1 to STp of FIG. 4B abnormally output gate signals to gate lines, whereby a problem may occur in that picture quality of the display device is deteriorated.

According to the fourth embodiment, the gate clock signals GCLK1 to GCLK8 and VDD control signal VDD_EO for controlling the output of the gate driver 11 for the (N−1)th frame period are completely supplied for the vertical blank period VBI of the (N−1)th frame period. And then, the start signal VST for controlling the output of the gate driver 11 for the Nth frame period is supplied within the vertical blank period VBI of the (N−1)th frame period. Therefore, in the fourth embodiment, the problem that picture quality of the display device is deteriorated as the p−1th to pth stages STp−1 to STp abnormally output gate signals to gate lines does not occur.

Also, the first gate signal GS1 should be supplied by the data driver 20 in accordance with a timing of the first image data TO1 supplied as the first data voltage. That is, to match the first gate signal GS1 with the timing of the first data voltage, the gate clock signals GCLK1 to GCLK8 are set to be generated within several numbers of horizontal periods after the start signal VST is fallen from the gate high voltage VGH to the gate low voltage VGL as shown in FIGS. 6A and 6B. Therefore, if an interval between the start signal VST and the active period ACT is increased as the length of the vertical blank period VBI is varied by the adaptive sync, a problem may occur in that the first gate signal GS1 is not synchronized with the timing of the first data voltage. In this case, picture quality of the display device is deteriorated.

In the fourth embodiment, there is no change in the interval between the start signal VST and the active period ACT even though the vertical blank period VBI is increased as shown in FIG. 13B by the adaptive sync. Therefore, the problem that the first gate signal GS1 is not synchronized with the timing of the first data voltage does not occur.

As described above, in the fourth embodiment, the gate clock signals GCLK1 to GCLK8 and VDD control signal VDD_EO for controlling the output of the gate driver 11 for the (N−1)th frame period are supplied. And then, the start signal VST for controlling the output of the gate driver 11 for the Nth frame period is supplied. Therefore, in the fourth embodiment, even though the frequency is changed by the adaptive sync, the problem that picture quality of the display device is deteriorated does not occur. Also, in the fourth embodiment, since there is no change in the interval between the start signal VST and the active period ACT even though the frequency is varied by the adaptive sync, the problem that the first gate signal GS1 is not synchronized with the timing of the first data voltage does not occur.

As described with reference to FIGS. 6A and 6*b*, in the first embodiment, since the timing controller 30 should output image data by delaying the image data by nine horizontal periods 9H, nine line memories are used. Also, as described with reference to FIGS. 10A and 10*b*, in the first embodiment, even though the length of the vertical blank period VBI is varied by frequency variation in the technology to which the adaptive sync is applied, the problem that picture quality of the display device is deteriorated does not occur. Also, the problem that the first gate signal GS1 is not synchronized with the timing of the first data voltage does not occur.

As described with reference to FIGS. 7A and 7B, in the second embodiment, since the timing controller 30 should output image data by delaying the image data by six horizontal periods 6H, six line memories are used. However, as described with reference to FIGS. 11A and 11B, in the second embodiment, if the length of the vertical blank period VBI is changed by frequency variation in the technology to which the adaptive sync is applied, the problem that picture quality of the display device is deteriorated does not occur. However, the problem that the first gate signal GS1 is not synchronized with the timing of the first data voltage may occur. Therefore, it is preferable that the second embodiment is not applied to the display device that includes the adaptive sync technology.

As described with reference to FIGS. 8A and 8B, in the third embodiment, since the timing controller 30 should output image data by delaying the image data by six horizontal periods 6H, six line memories are used. As described with reference to FIGS. 12A and 12B, in the third embodiment, if the length of the vertical blank period VBI is varied by frequency variation in the technology to which the adaptive sync is applied, the problem that the first gate signal GS1 is not synchronized with the timing of the first data voltage does not occur. However, the problem that picture quality of the display device is deteriorated may occur. Therefore, it is preferable that the third embodiment is not applied to the display device that includes the adaptive sync technology.

As described with reference to FIGS. 9A and 9B, in the third embodiment, since the timing controller 30 should output image data by delaying the image data by six horizontal periods 6H, six line memories are used. Also, as described with reference to FIGS. 13A and 13B, in the third embodiment, even though the length of the vertical blank period VBI is varied by frequency variation in the technology to which the adaptive sync is applied, the problem that picture quality of the display device is deteriorated does not occur.

As described above, according to the embodiment, the start signal may be generated based on the data enable signal. Particularly, according to the embodiment, the start signal is generated within the vertical blank period, whereby the number of line memories increased in accordance with the pulse width of the start signal may be reduced.

Also, according to the embodiment, after the gate clock signals and VDD control signal for controlling the output of the gate driver for the (N−1)th frame period are supplied, the start signal for controlling the output of the gate driver for the Nth frame period is supplied. Therefore, in the embodiment, even though the frequency is changed by the adaptive sync, the problem that picture quality of the display device is deteriorated does not occur.

Moreover, according to the embodiment, even though the frequency is changed by the adaptive sync, since there is no change in the interval between the start signal and the active period, the problem that the first gate signal is not synchronized with the timing of the first data voltage does not occur.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A display device comprising:

a display panel including gate lines, data lines, and pixels provided at crossing areas between the gate lines and the data lines;

a gate driver configured to supply gate signals to the gate lines; and a timing controller configured to supply a start signal and gate clock signals for controlling an operation timing of the gate driver to the gate driver, wherein one frame period includes an active period for supplying the gate signals to the gate lines and a vertical blank period for not supplying the gate signals to the gate lines, and wherein the start signal is for starting an output of the gate signals of the gate driver, wherein the start signal is supplied within the vertical blank period, wherein a pulse width of the start signal is changed if a frequency is changed in accordance with an adaptive sync technology, wherein the adaptive sync technology reduces the frequency by increasing the vertical blank period while maintaining the active period.

2. The display device of claim 1, wherein the pulse width of the start signal is changed if a length of the vertical blank period is changed.

3. The display device of claim 1, wherein the timing controller receives image data and a data enable signal, the data enable signal including real data enable signals generated for a period where the image data are input and dummy data enable signals generated for a period where the image data are not input.

4. The display device of claim 3, wherein the timing controller outputs the start signal in accordance with the data enable signal.

5. The display device of claim 4, wherein the start signal transitions from a first voltage level to a second voltage level based on a (x−u)th dummy data enable signal, where u is a positive integer, and x is a positive integer greater than u, of an (N−1)th frame period, and transitions from the second voltage level to the first voltage level based on a first real data enable signal of an Nth frame period, where N is a positive integer.

6. The display device of claim 3, wherein the timing controller includes:

a first counter configured to count a rising edge or falling edge of the data enable signal and outputting a first count signal when a counted value of the first counter is a first value or more;

a second counter configured to count a rising edge or falling edge of the data enable signal and outputting a second count signal when a counted value of the second counter is a second value or more; and a start signal generator configured to generate the start signal, wherein the start signal transitions to a second voltage level when the first count signal is received and wherein the start signal transitions to a first voltage level when the second count signal is received.

7. The display device of claim 6, further comprising a level shifter configured to shift the first voltage level of the start signal to a gate low voltage, and shift the second voltage level of the start signal to a gate high voltage.

8. A display device for displaying a video during a plurality of frames, the display device comprising:

a display panel including a plurality of gate lines, a plurality of data lines, and a plurality of pixels provided at crossing areas between the plurality of gate lines and the plurality of data lines;

a gate driver generating gate signals to be supplied to the gate lines, wherein each frame of the plurality of frames includes an active period when the gate signals are supplied to the gate lines, and a vertical blank period when gate signals are not supplied to the gate lines; and a timing controller supplying a start signal and gate clock signals for controlling an operation timing of the gate driver, wherein the start signal transitions from an active state to an inactive state within the vertical blank period, wherein the start signal is for starting an output of the gate signals of the gate driver, wherein a pulse width of the start signal is changed if a frequency is changed in accordance with an adaptive sync technology, wherein the adaptive sync technology reduces the frequency by increasing the vertical blank period while maintaining the active period.

9. The display device of claim 8, wherein a pulse width of the start signal is determined based on a duration of the vertical blank period.

10. The display device of claim 8, wherein the start signal transitions from the active to the inactive state a set amount of time after the start signal has transitioned from the inactive state to the active state.

11. The display device of claim 8, wherein the timing controller receives image data and a data enable signal, the data enable signal including real data enable signals generated for a period where the image data are input and dummy data enable signals generated for a period where the image data are not input.

12. The display device of claim 11, wherein the timing controller outputs the start signal in accordance with the data enable signal.

13. The display device of claim 12, wherein the start signal is risen by being synchronized with a (x−u)th dummy data enable signal, where u is a positive integer, and x is a positive integer greater than u, of an (N−1)th frame period, and is risen by being synchronized with a first real data enable signal of an Nth frame period.

14. The display device of claim 11, wherein the timing controller includes:

a first counter configured to count a rising edge or a falling edge of the data enable signal and outputting a first count signal when the counted value of the first counter is a first value or more;

a second counter configured to count a rising edge or a falling edge of the data enable signal 5 29272/33646/FW/10125745.1 and outputting a second count signal when a counted value of the second counter is a second value or more; and a start signal generator configured to generate the start signal, wherein the start signal transitions to a second voltage level when the first count signal is received and wherein the start signal transitions to a first level voltage when the second count signal is received.

15. The display device of claim 14, further comprising a level shifter configured to shift the first voltage level of the start signal to a gate low voltage, and shift the second voltage level of the start signal to a gate high voltage.

* * * * *